(12) United States Patent
Sharma

(10) Patent No.: US 10,454,481 B1
(45) Date of Patent: Oct. 22, 2019

(54) GAN LOGIC CIRCUITS

(71) Applicant: NAVITAS SEMICONDUCTOR, INC., El Segundo, CA (US)

(72) Inventor: Santosh Sharma, Laguna Niguel, CA (US)

(73) Assignee: NAVITAS SEMICONDUCTOR, INC, El Segundo, CA (US)

(*) Notice: Subject to any disclaimer, the term of this patent is extended or adjusted under 35 U.S.C. 154(b) by 0 days.

(21) Appl. No.: 16/375,394

(22) Filed: Apr. 4, 2019

(51) Int. Cl.
*H03K 19/20* (2006.01)
*H03K 19/0185* (2006.01)
*H01L 27/06* (2006.01)
*H03K 3/037* (2006.01)
*H01L 29/20* (2006.01)

(52) U.S. Cl.
CPC . *H03K 19/018507* (2013.01); *H01L 27/0605* (2013.01); *H01L 29/2003* (2013.01); *H03K 3/037* (2013.01); *H03K 19/20* (2013.01)

(58) Field of Classification Search
CPC ........... H03K 19/20; H03K 19/018507; H03K 3/037; H01L 27/0605; H01L 29/2003
USPC .... 327/108–112, 427, 434, 437; 326/82, 83, 326/87, 104, 112–122, 124–129
See application file for complete search history.

(56) References Cited

U.S. PATENT DOCUMENTS

| | | | | |
|---|---|---|---|---|
| 4,390,803 A * | 6/1983 | Koike | ............. | H03K 19/017 327/108 |
| 4,680,488 A * | 7/1987 | Okumura | ......... | H03K 19/0175 326/17 |
| 2014/0266321 A1* | 9/2014 | Telefus | ................... | H02J 7/025 327/108 |

* cited by examiner

*Primary Examiner* — Tomi Skibinski
(74) *Attorney, Agent, or Firm* — Kilpatrick Townsend & Stockton LLP

(57) ABSTRACT

A GaN digital circuit is disclosed. The circuit includes a first output node on a substrate, a pull up switch connected to a first output node and a power supply node having a second voltage, a capacitor having a first terminal configured to cause the voltage at the gate of the pull up switch to increase to substantially the sum of the second voltage and a third voltage in response to the voltage at the first output node increasing to the second voltage. The circuit also includes a first depletion mode charging switch configured to cause a voltage at the first terminal of the capacitor to become substantially equal to the third voltage while the voltage at the first output node is substantially equal to the first voltage and is configured to be substantially nonconductive while the voltage at the first output node is substantially equal to the second voltage.

20 Claims, 22 Drawing Sheets

GAN LOGIC CIRCUITS

FIELD OF THE INVENTION

The present invention relates generally to logic circuits and in particular to logic circuits utilizing one or more GaN-based logic circuits.

BACKGROUND OF THE INVENTION

Electronic devices such as computers, servers, telephones, and televisions, among others, employ one or more logic circuits to function. The logic circuits perform standard or application specific logic functions. As many electronic devices are sensitive to the size and efficiency of logic circuits, new logic circuits may be required to meet the needs of new electronic devices.

SUMMARY OF THE INVENTION

Another inventive aspect is a GaN digital circuit, including a substrate including GaN, a first output node on the substrate, where a voltage at the first output node is configured to switch between first and second voltages, where the first voltage is less than the second voltage, a pull up switch on the substrate, the pull up switch including a gate, a source connected to the first output node, and a drain connected to a power supply node having a voltage equal to or substantially equal to the second voltage, where the pull up switch is configured to cause a voltage at the first output node to be equal to the second voltage in response to a voltage at the gate, a capacitor on the substrate, the capacitor having a first terminal configured to cause the voltage at the gate to increase to substantially the sum of the second voltage and a third voltage in response to the voltage at the first output node increasing to the second voltage, and a first depletion mode charging switch on the substrate, where the first depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage.

Another inventive aspect is a GaN digital circuit, including a substrate including GaN, first and second GaN digital logic circuits on the substrate, where an output of the first GaN digital logic circuit is electrically connected with an input of the second GaN digital logic circuit, where each of the first and second GaN digital logic circuits includes a first output node on the substrate, where a voltage at the first output node is configured to switch between first and second voltages, where the first voltage is less than the second voltage, a pull up switch on the substrate, the pull up switch including a gate, a source connected to the first output node, and a drain connected to a power supply node having a voltage equal to or substantially equal to the second voltage, where the pull up switch is configured to cause a voltage at the first output node to be equal to the second voltage in response to a voltage at the gate, a capacitor on the substrate, the capacitor having a first terminal connected to the gate of the pull up switch, where the capacitor is configured to cause the voltage at the gate to increase to substantially the sum of the second voltage and a third voltage in response to the voltage at the first output node increasing to the second voltage, and a first depletion mode charging switch on the substrate, where the first depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

FIG. 1 is a simplified schematic of an embodiment of a GaN inverter 100, and FIG. 2 is a waveform diagram illustrating the operation of the inverter 100 of FIG. 1.

Inverter 100 includes pull down FET 110, pull down FET 120, pull up FET 130, pull up FET 140, resistive element 150, and capacitor 160. In some embodiments, resistive element 150 comprises a passive resistor. In some embodiments, resistive element 150 comprises a depletion mode (dmode) FET having its gate electrode connected to either output node O1 or output node O3. In some embodiments, resistive element 150 comprises both a passive resistor and a dmode FET having its gate electrode connected to either output node O1 or output node O3, where the drain and source terminals of the dmode FET are connected to opposite terminals of the passive resistor. In some embodiments, resistive element 150 comprises a resistive element FET having its drain or source connected to output node O1, its source or drain connected to the gate of pull up FET 130, and a gate driven by a circuit such that resistive element FET is conductive while the output at node O2 is low (0 or ground) and is nonconductive while the output at node O2 is high (Vb). As indicated in FIGS. 1 and 2, and discussed in further detail below, inverter 100 receives an input at node IN, and generates three outputs at nodes O1, O2, and O3, respectively. Any or all of the three outputs may be used as input signals to other circuitry. Which outputs are to be used is determined based on the functional needs of the other circuitry.

Figure 1:
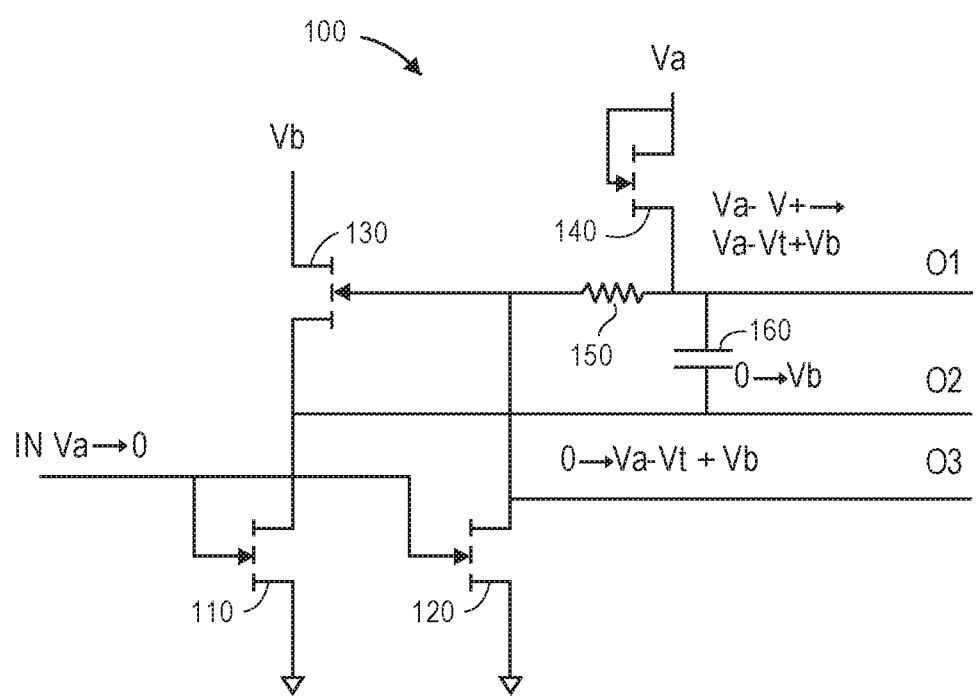
FIG. 1 is a simplified schematic of an embodiment of a GaN inverter.
Figure 2:
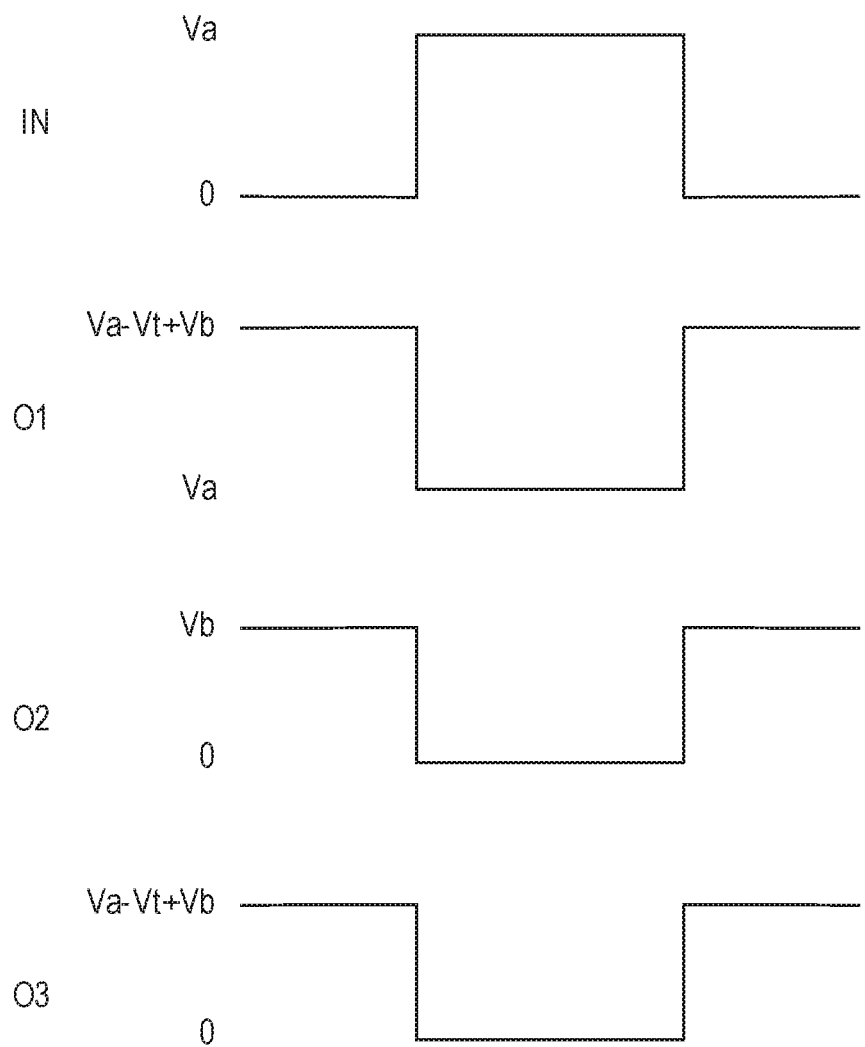
FIG. 2 is a waveform diagram illustrating the operation of the inverter of FIG. 1.

With reference to FIGS. 1 and 2, in operation, while the input at node IN is high (Va), the outputs at nodes O2 and O3 are pulled low to ground or substantially ground by pull down FETs 110 and 120. As a consequence of the voltage at output node O3 being ground, pull up FET 130 is off. In addition, the output at node O1 is pulled low by capacitor 160 and held at a power voltage Va minus a threshold voltage (Vt) of pull up FET 140 by pull up FET 140.

In addition, while the input at node IN is low (0 or ground), the outputs at nodes O2 and O3 are not held to ground or substantially ground by pull down FETs 110 and 120. Consequently, current flows through resistive element 150 from output node O1 to output node O3. As a result, the voltage at output node O3 increases. Once the voltage at output node O3 exceeds the threshold voltage of pull up FET 130, pull up FET 130 turns on, and the voltage at output node O2 increases toward power voltage Vb. The increase in the voltage at output node O2 is coupled by capacitor 160 to output node O1 and from output node O1 to output node O3 through resistive element 150. The voltages at output nodes O1, O2, and O3 continue to increase until the voltage at output node O2 becomes equal or substantially equal to the power voltage Vb, the voltage at output node O1 becomes equal or substantially equal to power voltage Va minus Vt plus power voltage Vb, and the voltage at output node O3 becomes equal or substantially equal to power voltage Va minus Vt plus power voltage Vb.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of the inverter 100.

Figure 3:
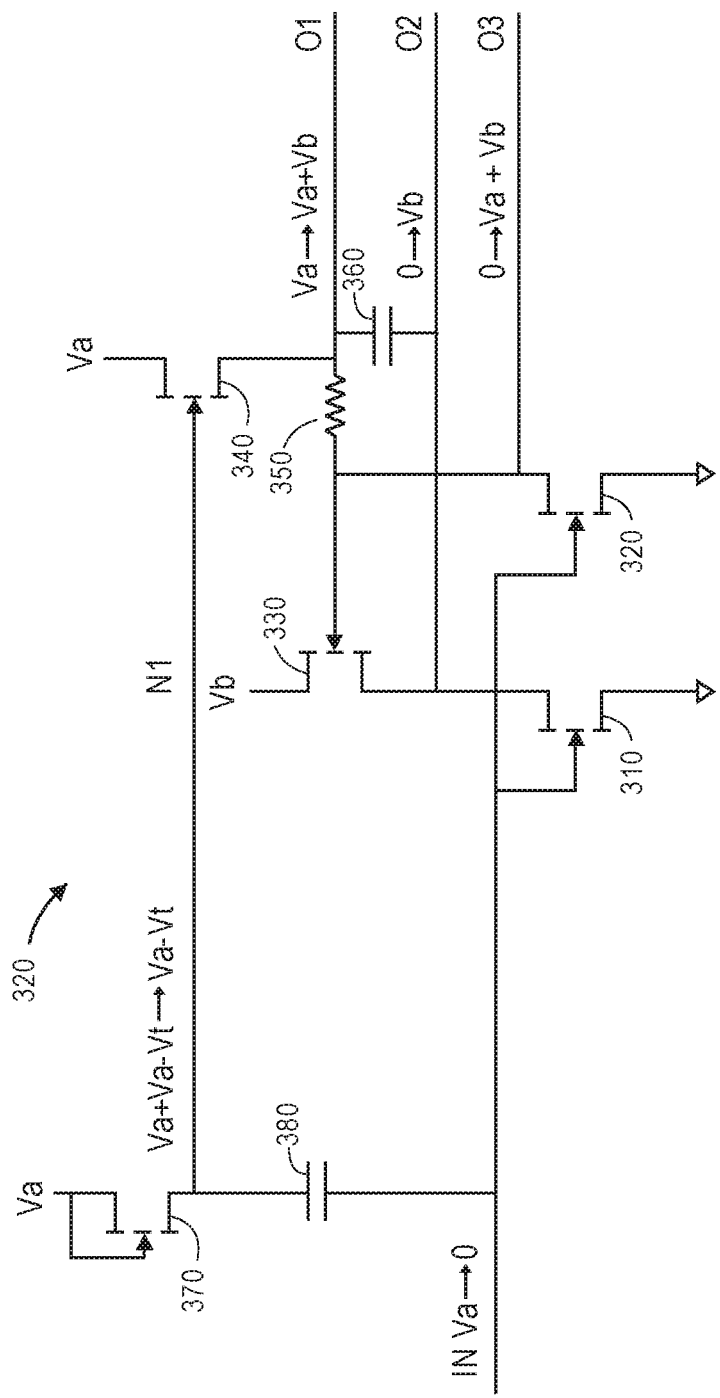
FIG. 3 is a simplified schematic of an embodiment of a GaN inverter.
Figure 4:
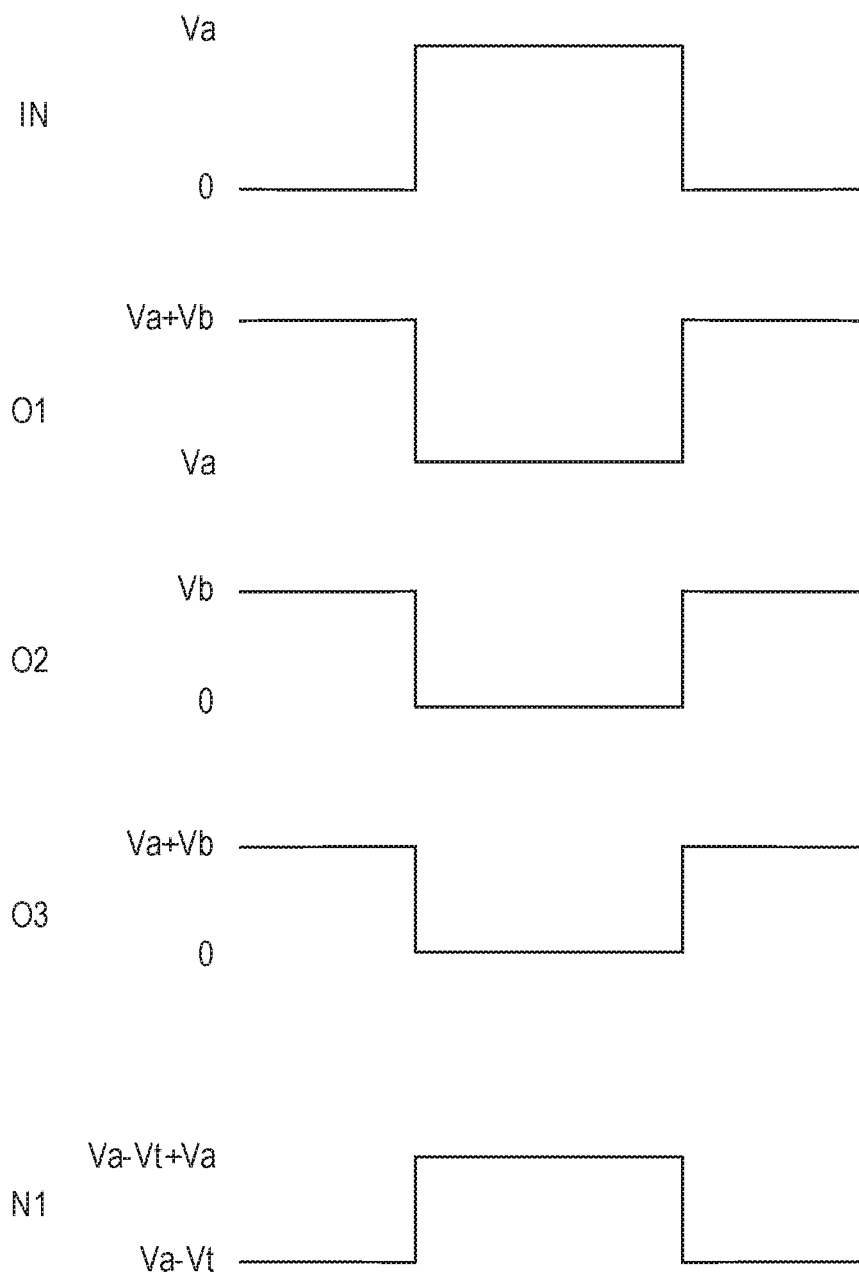
FIG. 4 is a waveform diagram illustrating the operation of the inverter of FIG. 3.

FIG. 3 is a simplified schematic of an embodiment of a GaN inverter 300, and FIG. 4 is a waveform diagram illustrating the operation of the inverter 300 of FIG. 3.

Inverter 300 includes pull down FET 310, pull down FET 320, pull up FET 330, pull up FET 340, resistive element 350, capacitor 360, level shift FET 370 and level shift capacitor 380. In some embodiments, resistive element 350 comprises a passive resistor. In some embodiments, resistive element 350 comprises a dmode FET having its gate electrode connected to either output node O1 or output node O3. In some embodiments, resistive element 350 comprises both a passive resistor and a dmode FET having its gate electrode connected to either output node O1 or output node O3, where the drain and source terminals of the dmode FET are connected to opposite terminals of the passive resistor. In some embodiments, resistive element 350 comprises a resistive element FET having its drain or source connected to output node O1, its source or drain connected to the gate of pull up FET 330, and a gate driven by a circuit such that resistive element FET is conductive while the output at node O2 is low (0 or ground) and is nonconductive while the output at node O2 is high (Vb). In some embodiments, other level shift circuits are used instead of level shift FET 370 and level shift capacitor 380. As indicated in FIGS. 3 and 4, and discussed in further detail below, inverter 300 receives an input at node IN, and generates three outputs at nodes O1, O2, and O3, respectively. Any or all of the three outputs may be used as input signals to other circuitry. Which outputs are to be used is determined based on the functional needs of the other circuitry.

With reference to FIGS. 3 and 4, in operation, while the input at node IN is high (Va), the outputs at nodes O2 and O3 are pulled low to ground or substantially ground by pull down FETs 310 and 320. As a consequence of the voltage at output node O3 being ground, pull up FET 330 is off. In addition, the voltage at node N1 is capacitively coupled high by level shift capacitor 380 and is equal or substantially equal to a power voltage Va minus a threshold voltage (Vt) of level shift FET 370 plus the power voltage Va (Va−Vt+Va). As a consequence of the voltage at node N1 being equal or substantially equal to Va−Vt+Va, pull up FET 340 causes the voltage at output node O1 to be equal or substantially equal to power voltage Va.

In addition, while the input at node IN is low (0 or ground), the outputs at nodes O2 and O3 are not held to ground or substantially ground by pull down FETs 310 and 320. Consequently, current flows through resistive element 350 from output node O1 to output node O3. As a result, the voltage at output node O3 increases. Once the voltage at output node O3 exceeds the threshold voltage of pull up FET 330, pull up FET 330 turns on, and the voltage at output node O2 increases toward power voltage Vb. The increase in the voltage at output node O2 is coupled by capacitor 360 to output node O1 and from output node O1 to output node O3 through resistive element 350. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

In some embodiments, power voltage Vb is equal or substantially equal to power voltage Va. Based on what voltages are supplied to the separate connections for power voltages Va and Vb, the voltage outputs are controllable. As FIG. 5 is a simplified schematic of an embodiment of a GaN inverter 500, and FIG. 6 is a waveform diagram illustrating the operation of the inverter 500 of FIG. 1.

Inverter 500 includes pull down FET 510, pull down FET 520, pull up FET 530, dmode pull up FET 540, resistive element 550, and capacitor 560. In some embodiments, resistive element 550 comprises a passive resistor. In some embodiments, resistive element 550 comprises a dmode FET having its gate electrode connected to either output node O1 or output node O3. In some embodiments, resistive element 550 comprises both a passive resistor and a dmode FET having its gate electrode connected to either output node O1 or output node O3, where the drain and source terminals of the dmode FET are connected to opposite terminals of the passive resistor. In some embodiments, resistive element 550 comprises a resistive element FET having its drain or source connected to output node O1, its source or drain connected to the gate of pull up FET 530, and a gate driven by a circuit such that resistive element FET is conductive while the output at node O2 is low (0 or ground) and is nonconductive while the output at node O2 is high (Vb). As indicated in FIGS. 1 and 2, and discussed in further detail below, inverter 500 receives an input at node IN, and generates three outputs at nodes O1, O2, and O3, respectively. Any or all of the three outputs may be used as input signals to other circuitry. Which outputs are to be used is determined based on the functional needs of the other circuitry.

Figure 5:
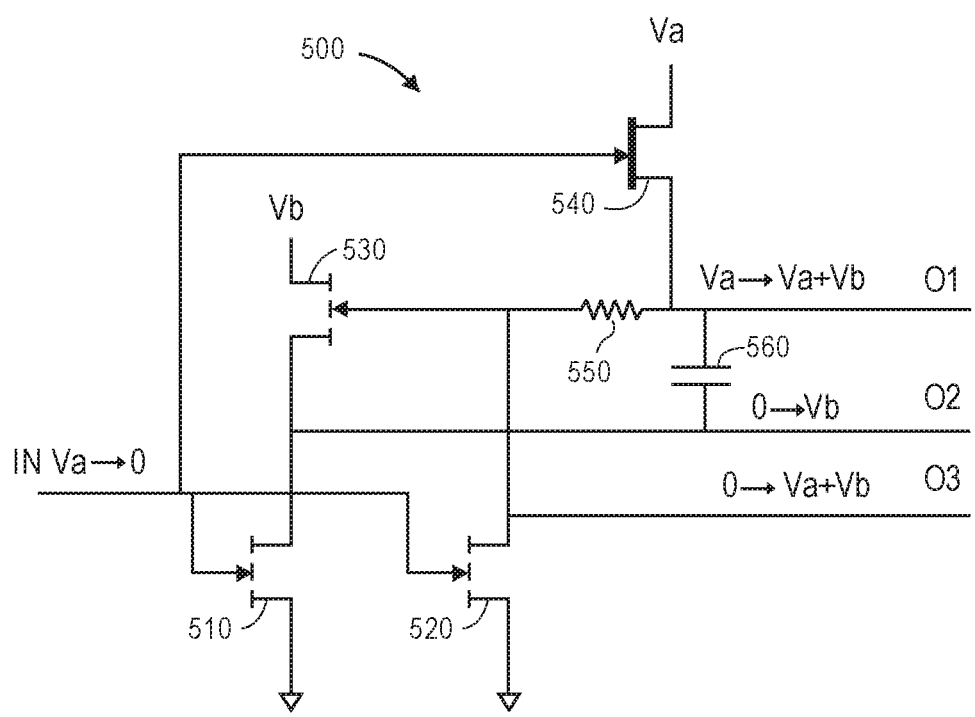
FIG. 5 is a simplified schematic of an embodiment of a GaN inverter.
Figure 6:
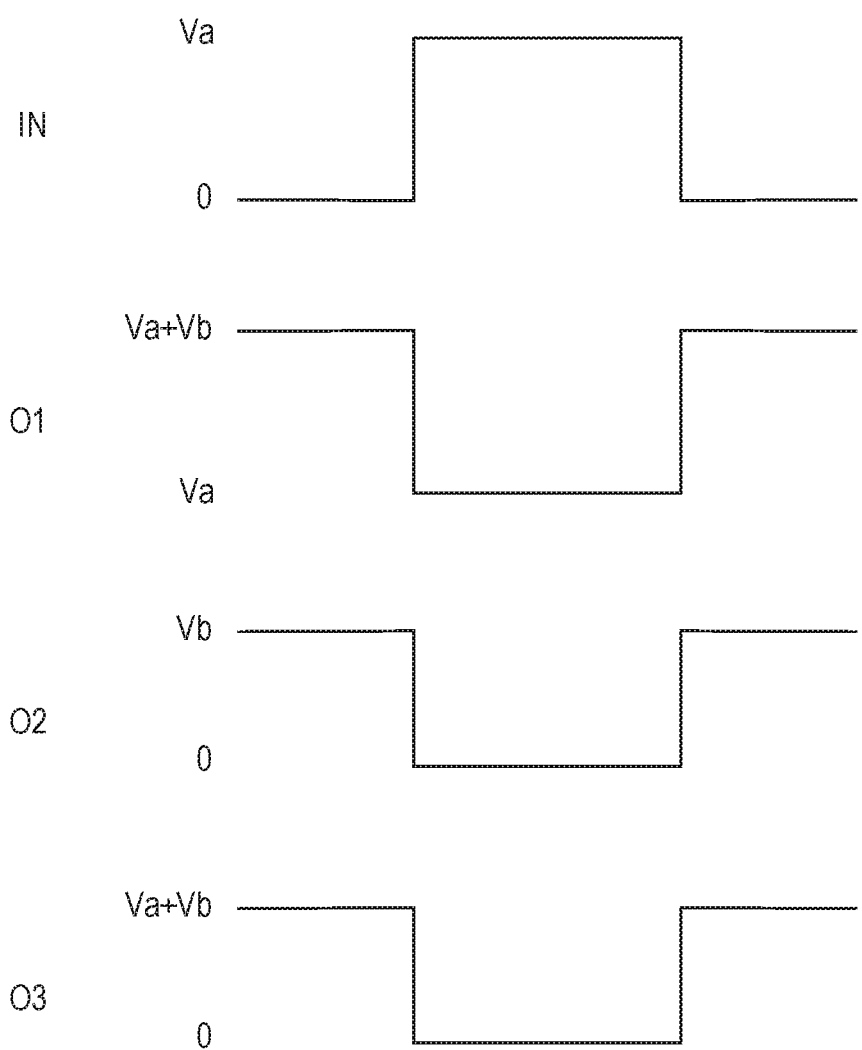
FIG. 6 is a waveform diagram illustrating the operation of the inverter of FIG. 5.

With reference to FIGS. 5 and 6, in operation, while the input at node IN is high (Va), the outputs at nodes O2 and O3 are pulled low to ground or substantially ground by pull down FETs 510 and 520. As a consequence of the voltage at output node O3 being ground, pull up FET 530 is off. In addition, the output at node O1 is pulled low by capacitor 560 and held at a power voltage Va by dmode pull up FET 540.

In addition, while the input at node IN is low (0 or ground), the outputs at nodes O2 and O3 are not held to ground or substantially ground by pull down FETs 510 and 520. Consequently, current flows through resistive element 550 from output node O1 to output node O3. As a result, the voltage at output node O3 increases. Once the voltage at output node O3 exceeds the threshold voltage of pull up FET 530, pull up FET 530 turns on, and the voltage at output node O2 increases toward power voltage Vb. In some embodiments, power voltage Vb is equal or substantially equal to power voltage Va. The increase in the voltage at output node O2 is coupled by capacitor 560 to output node O1 and from output node O1 to output node O3 through resistive element 550. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of the inverter 500.

Figure 7:
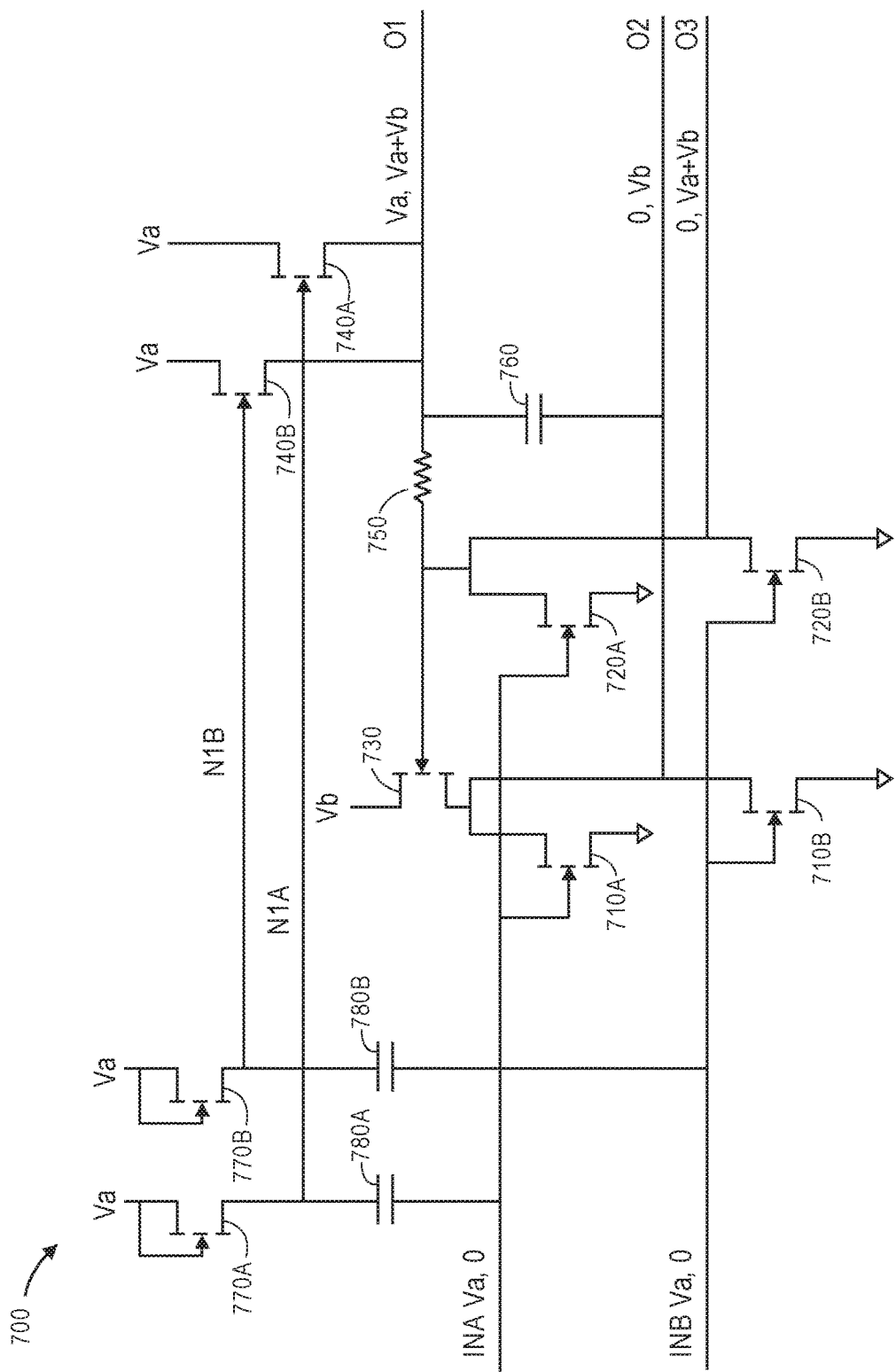
FIG. 7 is a simplified schematic of an embodiment of a GaN NOR gate.
Figure 8:
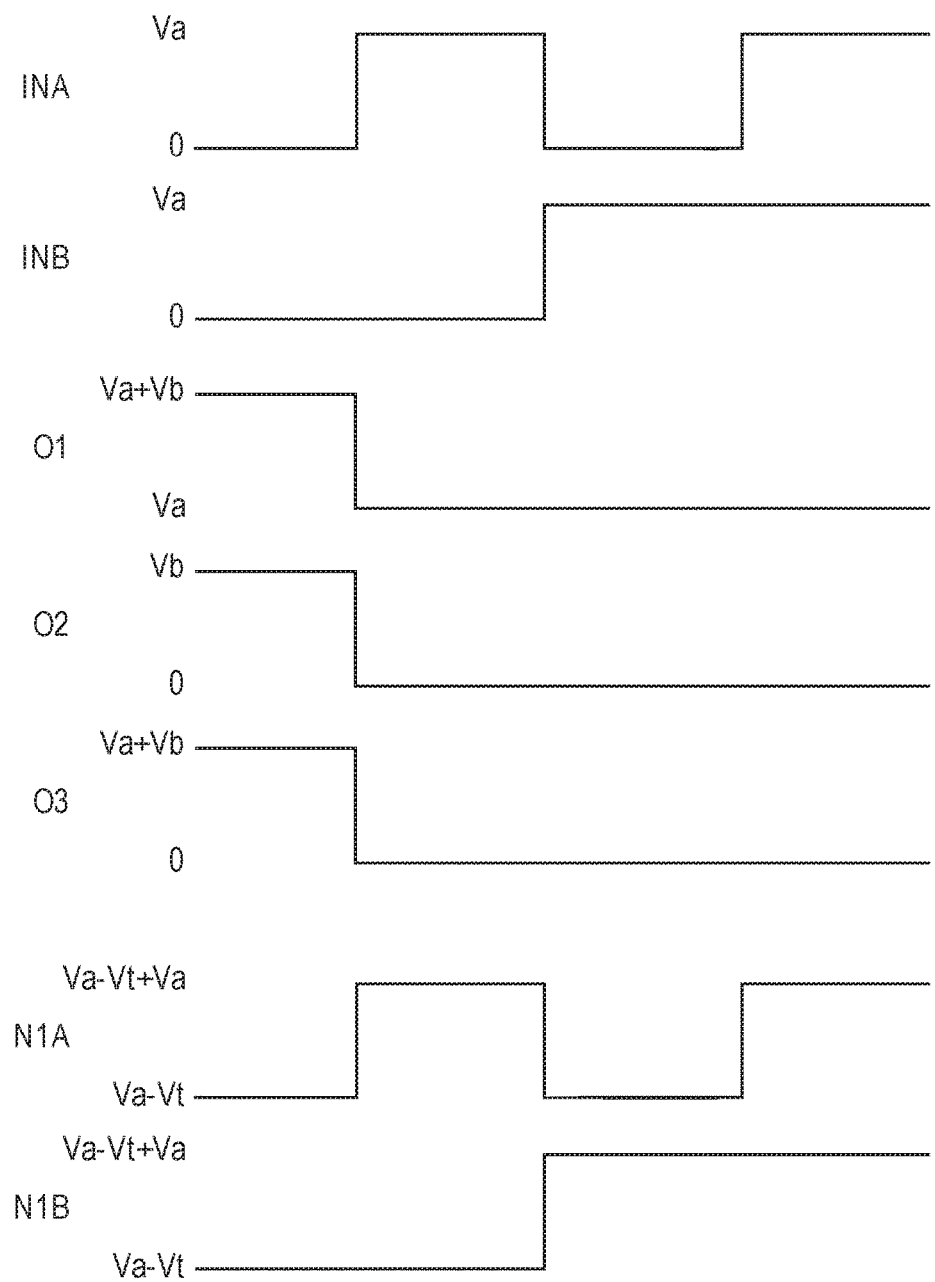
FIG. 8 is a waveform diagram illustrating the operation of the NOR gate of FIG. 7.

FIG. 7 is a simplified schematic of an embodiment of a GaN NOR gate 700, and FIG. 8 is a waveform diagram illustrating the operation of the NOR gate 700 of FIG. 7.

NOR gate 700 includes pull down FETs 710A and 710B, pull down FETs 720A and 720B, pull up FET 730, pull up FETs 740A and 740B, resistive element 750, capacitor 760, level shift FETs 770A and 770B, and level shift capacitors 780A and 780B. In some embodiments, resistive element 750 comprises a passive resistor. In some embodiments, resistive element 750 comprises a dmode FET having its gate electrode connected to either output node O1 or output node O3. In some embodiments, resistive element 750 comprises both a passive resistor and a dmode FET having its gate electrode connected to either output node O1 or output node O3, where the drain and source terminals of the dmode FET are connected to opposite terminals of the passive resistor. In some embodiments, resistive element 750 comprises a resistive element FET having its drain or source connected to output node O1, its source or drain connected to the gate of pull up FET 730, and a gate driven by a circuit such that resistive element FET is conductive while the output at node O2 is low (0 or ground) and is nonconductive while the output at node O2 is high (Vb). In some embodiments, other level shift circuits are used instead of level shift FETs 770A and 770B, and level shift capacitors 780A and 780B. As indicated in FIGS. 7 and 8, and discussed in further detail below, NOR gate 700 receives inputs at nodes INA and INB, and generates three outputs at nodes O1, O2, and O3, respectively. Any or all of the three outputs may be used as input signals to other circuitry. Which outputs are to be used is determined based on the functional needs of the other circuitry.

With reference to FIGS. 7 and 8, in operation, while the input at either of nodes INA and INB is high (Va), the output at node O2 is pulled low to ground or substantially ground by one or more of pull down FETs 710A and 710B. Similarly, the output at node O3 is pulled low to ground or substantially ground by one or more of pull down FETs 720A and 720B. As a consequence of the voltage at output node O3 being ground, pull up FET 730 is off. In addition, the voltage at one or more of node N1A and N1B is capacitively coupled high by one or more of level shift capacitor 780A and 780B, and is equal or substantially equal to a power voltage Va minus a threshold voltage (Vt) plus the power voltage Va (Va−Vt+Va). As a consequence of the voltage at one or more of nodes N1A and N1B being equal or substantially equal to Va−Vt+Va, one or more of pull up FETs 740A and 740B cause the voltage at output node O1 to be equal or substantially equal to power voltage Va.

In addition, while the inputs at both nodes INA and INB are low (0 or ground), the outputs at nodes O2 and O3 are not held to ground or substantially ground by any of pull down FETs 710A, 710B, 720A and 720B. Consequently, current flows through resistive element 750 from output node O1 to output node O3. As a result, the voltage at output node O3 increases. Once the voltage at output node O3 exceeds the threshold voltage of pull up FET 730, pull up FET 730 turns on, and the voltage at output node O2 increases toward power voltage Vb. In some embodiments, power voltage Vb is equal or substantially equal to power voltage Va. The increase in the voltage at output node O2 is coupled by capacitor 760 to output node O1 and from output node O1 to output node O3 through resistive element 750. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

As understood by those of skill in the art, a three input NOR gate may be formed by adding:
- an additional pull down FET 710C connected to output node O2, a third input INC, and ground;
- an additional pull down FET 720C connected to the gate of FET 730, the third input INC, and ground;
- an additional pull up FET 740C connected to power voltage Va, the output of an additional level shift circuit having its input connected to the third input INC, and output node O1; and
- the additional level shift circuit, which may have a level shift FET 770C similar to level shift FETs 770A and 770B, and a level shift capacitor 780C similar to level shift capacitors 780A and 780B.

As understood by those of skill in the art, NOR gates having more than three inputs may be formed by similarly increasing the number of pull down FETs, pull up FETs and level shift circuits.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of NOR gate 700.

Figure 9:
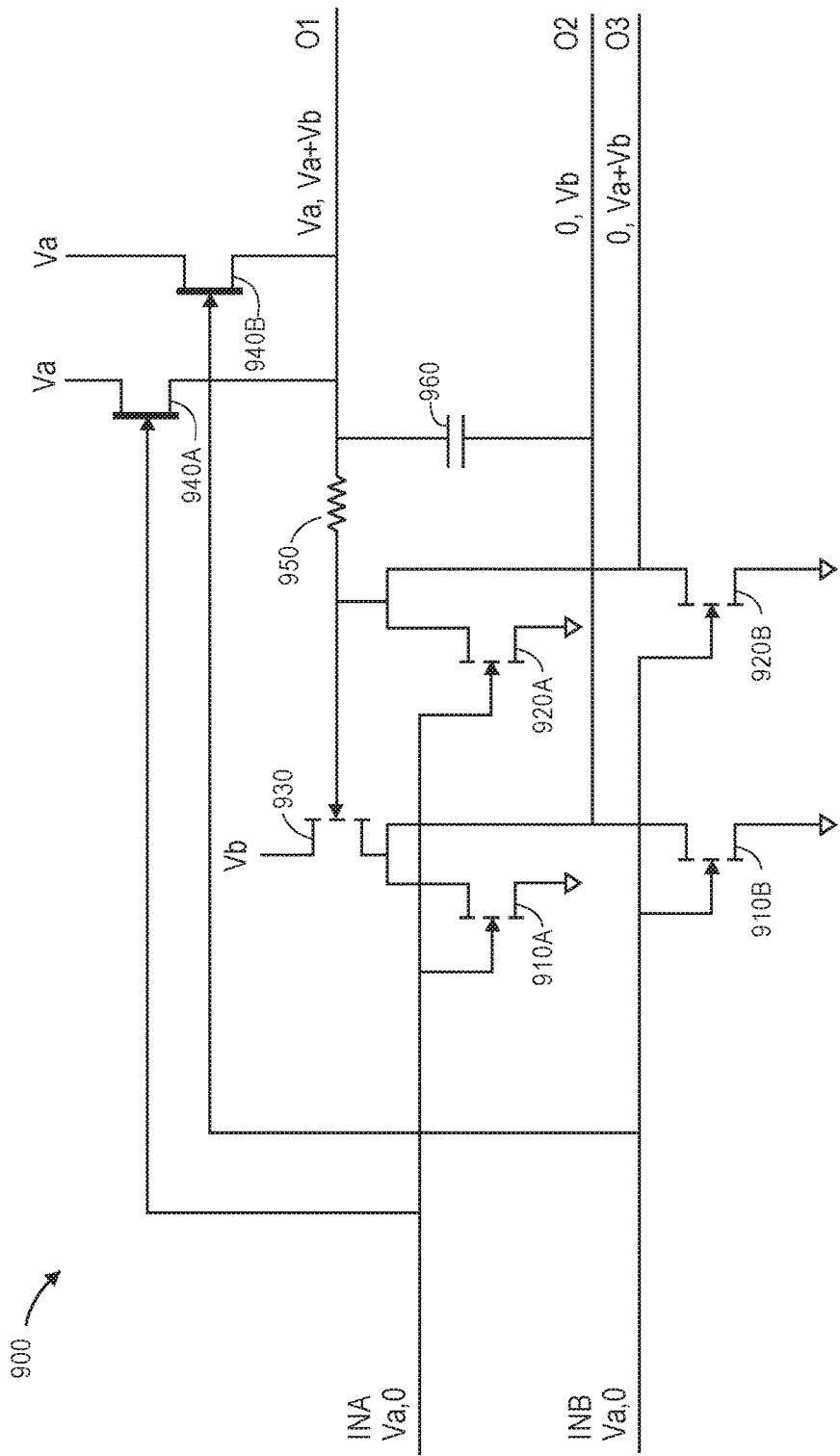
FIG. 9 is a simplified schematic of an embodiment of a GaN NOR gate.
Figure 10:
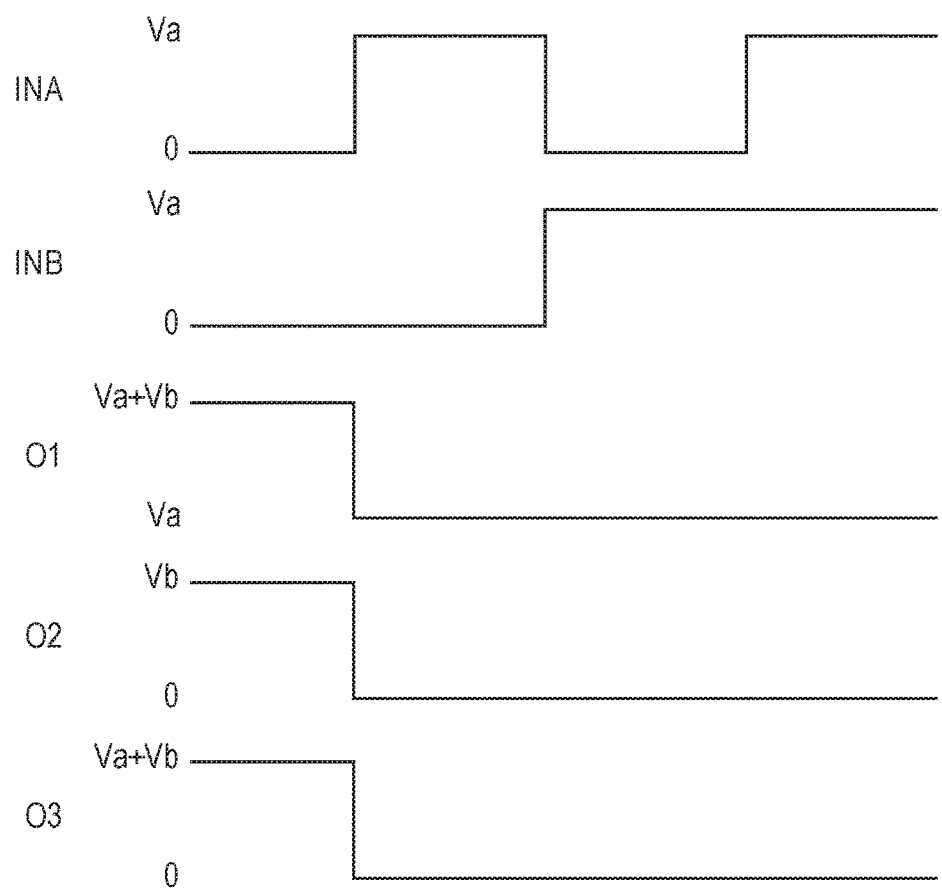
FIG. 10 is a waveform diagram illustrating the operation of the NOR gate of FIG. 9.

FIG. 9 is a simplified schematic of an embodiment of a GaN NOR gate 900, and FIG. 10 is a waveform diagram illustrating the operation of the NOR gate 900 of FIG. 9.

NOR gate 900 includes pull down FETs 910A and 910B, pull down FETs 920A and 920B, pull up FET 930, dmode pull up FETs 940A and 940B, resistive element 950, and capacitor 960. In some embodiments, resistive element 950 comprises a passive resistor. In some embodiments, resistive element 950 comprises a dmode FET having its gate electrode connected to either output node O1 or output node O3. In some embodiments, resistive element 950 comprises both a passive resistor and a dmode FET having its gate electrode connected to either output node O1 or output node O3, where the drain and source terminals of the dmode FET are connected to opposite terminals of the passive resistor. In some embodiments, resistive element 950 comprises a resistive element FET having its drain or source connected to output node O1, its source or drain connected to the gate of pull up FET 930, and a gate driven by a circuit such that resistive element FET is conductive while the output at node O2 is low (0 or ground) and is nonconductive while the output at node O2 is high (Vb). As indicated in FIGS. 9 and 10, and discussed in further detail below, NOR gate 900 receives inputs at nodes INA and INB, and generates three outputs at nodes O1, O2, and O3, respectively. Any or all of the three outputs may be used as input signals to other circuitry. Which outputs are to be used is determined based on the functional needs of the other circuitry.

With reference to FIGS. 9 and 10, in operation, while the input at either of nodes INA and INB is high (Va), the output at node O2 is pulled low to ground or substantially ground by one or more of pull down FETs 910A and 910B. Similarly, the output at node O3 is pulled low to ground or substantially ground by one or more of pull down FETs 920A and 920B. As a consequence of the voltage at output node O3 being ground, pull up FET 930 is off. In addition, the voltage at node O1 is pulled low by capacitor 960 and held at a power voltage Va by one or more of dmode pull up FETs 940A and 940B.

In addition, while the inputs at both nodes INA and INB are low (0 or ground), the outputs at nodes O2 and O3 are not held to ground or substantially ground by any of pull down FETs 910A, 910B, 920A and 920B. Consequently, current flows through resistive element 950 from output node O1 to output node O3. As a result, the voltage at output node O3 increases. Once the voltage at output node O3 exceeds the threshold voltage of pull up FET 930, pull up FET 930 turns on, and the voltage at output node O2 increases toward power voltage Vb. In some embodiments, power voltage Vb is equal or substantially equal to power voltage Va. The increase in the voltage at output node O2 is coupled by capacitor 960 to output node O1 and from output node O1 to output node O3 through resistive element 950. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

As understood by those of skill in the art, a three input NOR gate may be formed by adding:
- an additional pull down FET 910C connected to output node O2, a third input INC, and ground;
- an additional pull down FET 920C connected to the gate of FET 930, the third input INC, and ground; and
- an additional dmode pull up FET 940C connected to power voltage Va, the third input INC, and output node O1.

As understood by those of skill in the art, NOR gates having more than three inputs may be formed by similarly increasing the number of pull down FETs and dmode pull up FETs.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of NOR gate 700.

Figure 11:
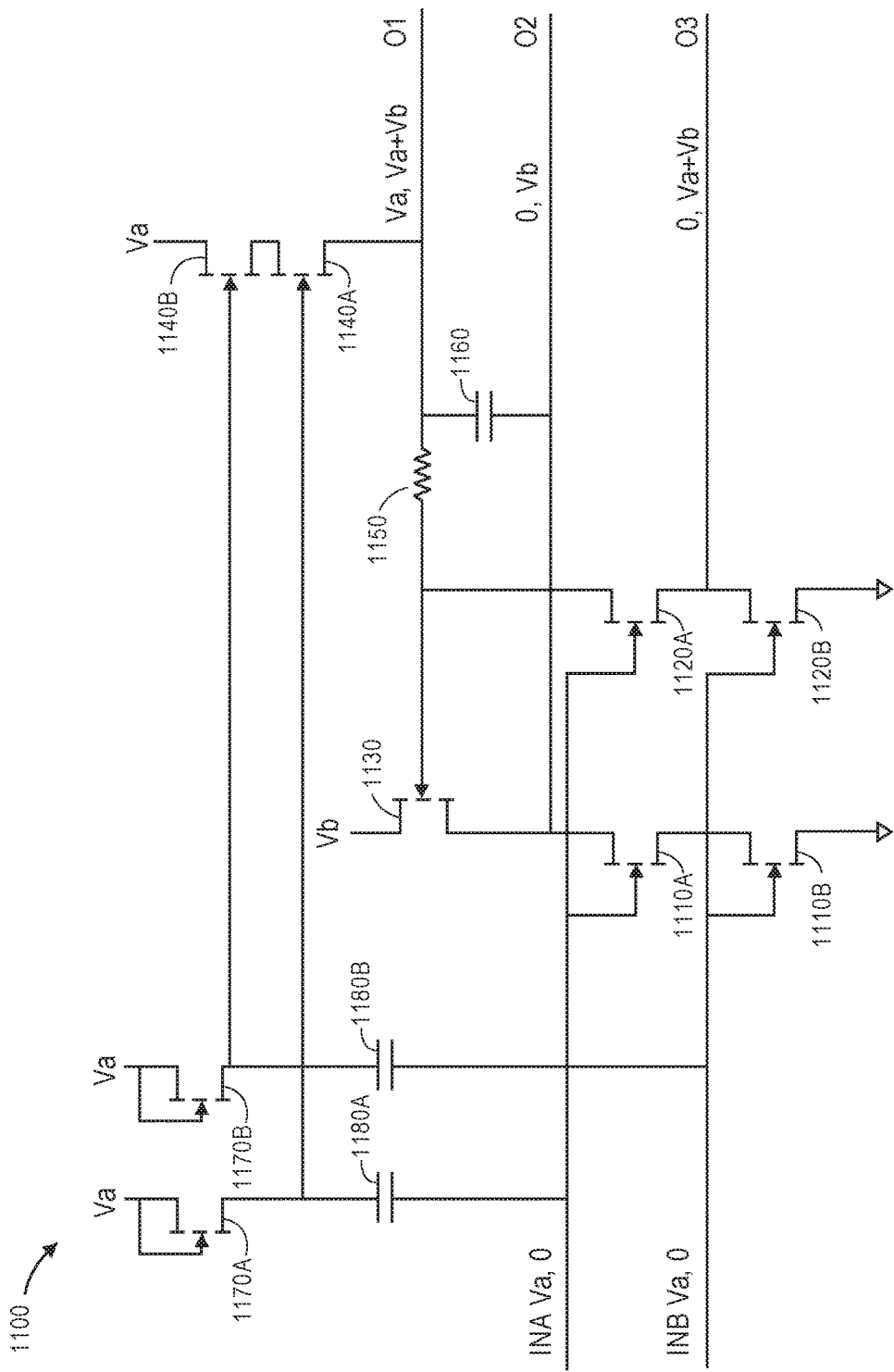
FIG. 11 is a simplified schematic of an embodiment of a GaN NAND gate.

FIG. 11 is a simplified schematic of an embodiment of a GaN NAND gate 1100, and FIG. 10 is a waveform diagram illustrating the operation of the NAND gate 1100 of FIG. 11.

Figure 12:
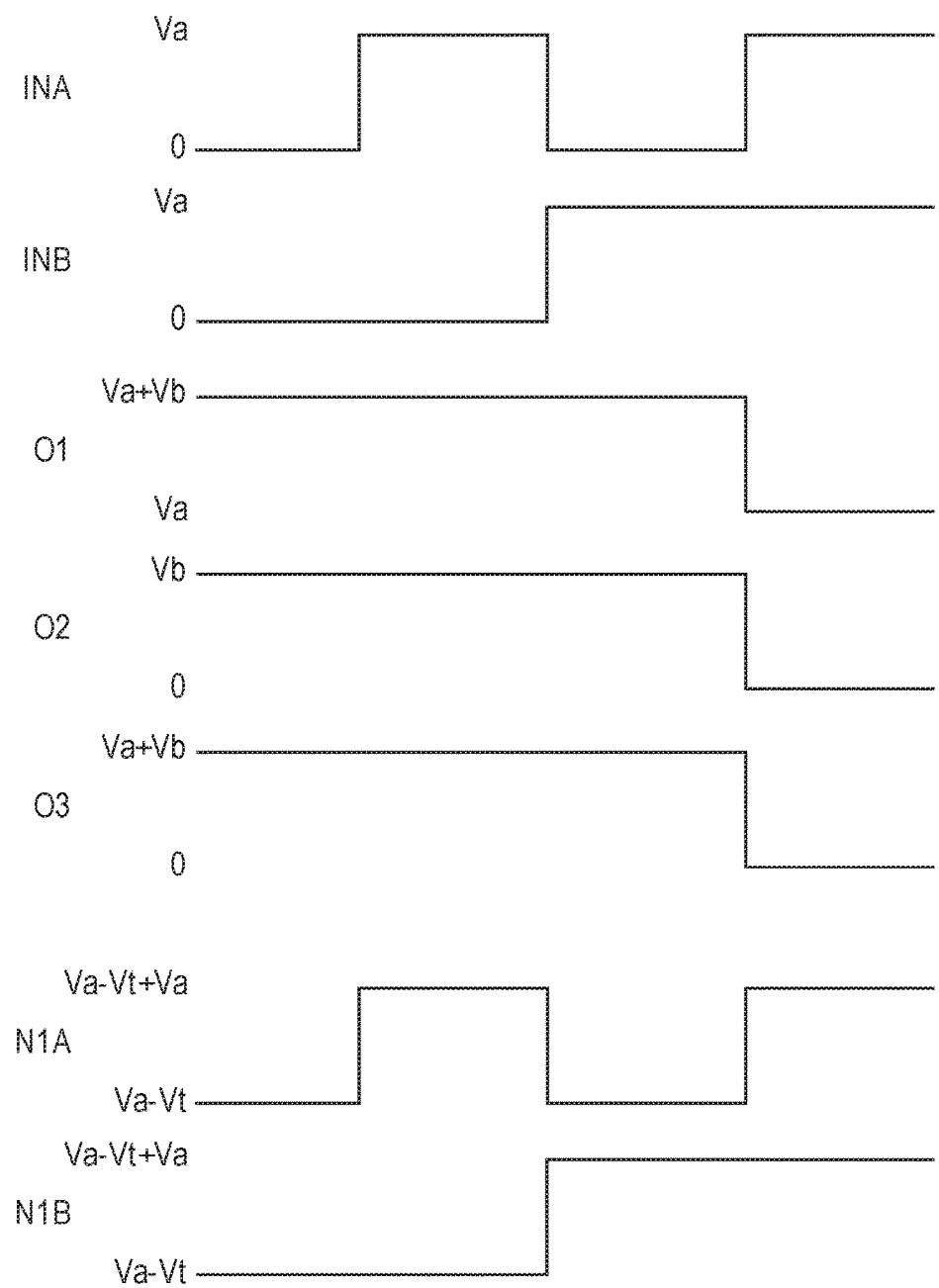
FIG. 12 is a waveform diagram illustrating the operation of the NAND gate of FIG. 11.

NOR gate 1100 includes pull down FETs 1110A and 1110B, pull down FETs 1120A and 1120B, pull up FET 1130, pull up FETs 1140A and 1140B, resistive element 1150, capacitor 1160, level shift FETs 1170A and 1170B, and level shift capacitors 1180A and 1180B. In some embodiments, resistive element 1150 comprises a passive resistor. In some embodiments, resistive element 1150 comprises a dmode FET having its gate electrode connected to either output node O1 or output node O3. In some embodiments, resistive element 1150 comprises both a passive resistor and a dmode FET having its gate electrode connected to either output node O1 or output node O3, where the drain and source terminals of the dmode FET are connected to opposite terminals of the passive resistor. In some embodiments, resistive element 1150 comprises a resistive element FET having its drain or source connected to output node O1, its source or drain connected to the gate of pull up FET 1130, and a gate driven by a circuit such that resistive element FET is conductive while the output at node O2 is low (0 or ground) and is nonconductive while the output at node O2 is high (Vb). In some embodiments, other level shift circuits are used instead of level shift FETs 1170A and 1170B, and level shift capacitors 1180A and 1180B. As indicated in FIGS. 11 and 12, and discussed in further detail below, NAND gate 1100 receives inputs at nodes INA and INB, and generates three outputs at nodes O1, O2, and O3, respectively. Any or all of the three outputs may be used as input signals to other circuitry. Which outputs are to be used is determined based on the functional needs of the other circuitry.

With reference to FIGS. 11 and 12, in operation, while the inputs at both nodes INA and INB are high (Va), the output at node O2 is pulled low to ground or substantially ground by pull down FETs 1110A and 1110B. Similarly, the output at node O3 is pulled low to ground or substantially ground by pull down FETs 1120A and 1120B. As a consequence of the voltage at output node O3 being ground, pull up FET 1130 is off. In addition, the voltages nodes N1A and N1B are respectively capacitively coupled high by level shift capacitors 1180A and 1180B, and are equal or substantially equal to a power voltage Va minus a threshold voltage (Vt) plus the power voltage Va (Va−Vt+Va). As a consequence of the voltage at nodes N1A and N1B being equal or substantially equal to Va−Vt+Va, pull up FETs 1140A and 1140B are conductive and cause the voltage at output node O1 to be equal or substantially equal to power voltage Va.

In addition, while the input at either of nodes INA and INB are low (0 or ground), the outputs at nodes O2 and O3 are not held to ground or substantially ground by pull down FETs 1110A, 1110B, 1120A and 1120B. Consequently, current flows through resistive element 1150 from output node O1 to output node O3. As a result, the voltage at output node O3 increases. Once the voltage at output node O3 exceeds the threshold voltage of pull up FET 1130, pull up FET 1130 turns on, and the voltage at output node O2 increases toward power voltage Vb. In some embodiments, power voltage Vb is equal or substantially equal to power voltage Va. The increase in the voltage at output node O2 is coupled by capacitor 1160 to output node O1 and from output node O1 to output node O3 through resistive element 1150. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

As understood by those of skill in the art, a three input NAND gate may be formed by adding:
- an additional pull down FET 1110C connected in series with pull down FETs 1110A and 1110B between output node O2 and ground, and connected to a third input INC;
- an additional pull down FET 1120C connected in series with pull down FETs 1120A and 1120B between gate of FET 1130 and ground, and connected to the third input INC;
- an additional pull up FET 1140C connected in series with pull up FETs 1140A and 1140B between power voltage Va and output node O1, an to the output of an additional level shift circuit having its input connected to the third input INC; and
- the additional level shift circuit, which may have a level shift FET 1170C similar to level shift FETs 1170A and 1170B, and a level shift capacitor 1180C similar to level shift capacitors 1180A and 1180B.

As understood by those of skill in the art, NAND gates having more than three inputs may be formed by similarly increasing the number of pull down FETs, pull up FETs and level shift circuits.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of NAND gate 1100.

Figure 13:
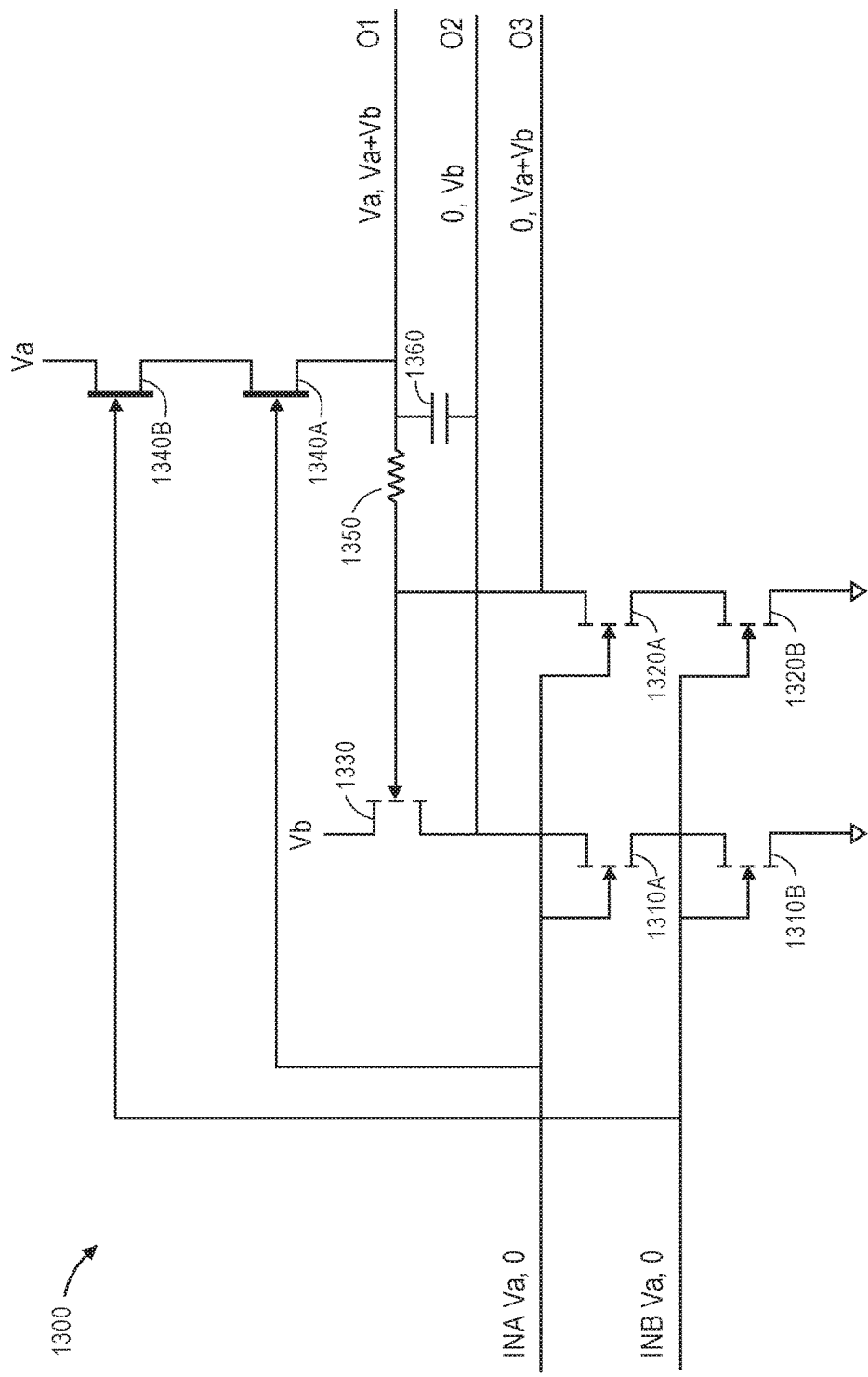
FIG. 13 is a simplified schematic of an embodiment of a GaN NAND gate.
Figure 14:
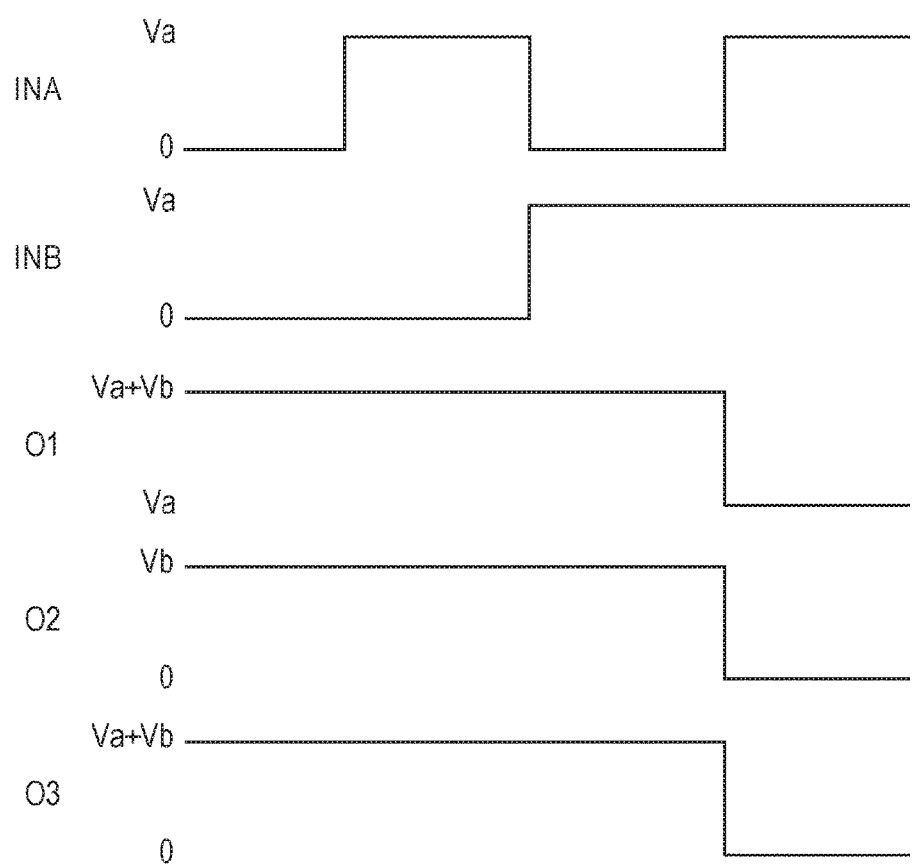
FIG. 14 is a waveform diagram illustrating the operation of the NAND gate of FIG. 13.

FIG. 13 is a simplified schematic of an embodiment of a GaN NAND gate 1300, and FIG. 14 is a waveform diagram illustrating the operation of the NAND gate 1300 of FIG. 13.

NAND gate 1300 includes pull down FETs 1310A and 1310B, pull down FETs 1320A and 1320B, pull up FET 1330, dmode pull up FETs 1340A and 1340B, resistive element 1350, and capacitor 1360. In some embodiments, resistive element 1350 comprises a passive resistor. In some embodiments, resistive element 1350 comprises a dmode FET having its gate electrode connected to either output node O1 or output node O3. In some embodiments, resistive element 1350 comprises both a passive resistor and a dmode FET having its gate electrode connected to either output node O1 or output node O3, where the drain and source terminals of the dmode FET are connected to opposite terminals of the passive resistor. In some embodiments, resistive element 1350 comprises a resistive element FET having its drain or source connected to output node O1, its source or drain connected to the gate of pull up FET 1330, and a gate driven by a circuit such that resistive element FET is conductive while the output at node O2 is low (0 or ground) and is nonconductive while the output at node O2 is high (Vb). As indicated in FIGS. 13 and 14, and discussed in further detail below, NOR gate 1300 receives inputs at nodes INA and INB, and generates three outputs at nodes O1, O2, and O3, respectively. Any or all of the three outputs may be used as input signals to other circuitry. Which outputs are to be used is determined based on the functional needs of the other circuitry.

With reference to FIGS. 13 and 14, in operation, while the inputs at both nodes INA and INB are high (Va), the output at node O2 is pulled low to ground or substantially ground by one or more of pull down FETs 1310A and 1310B. Similarly, the output at node O3 is pulled low to ground or substantially ground by one or more of pull down FETs 1320A and 1320B. As a consequence of the voltage at output node O3 being ground, pull up FET 1330 is off. In addition, the voltage at node O1 is pulled low by capacitor 1360 and held at a power voltage Va by dmode pull up FETs 1340A and 1340B.

In addition, while the inputs at either of nodes INA and INB are low (0 or ground), the outputs at nodes O2 and O3 are not held to ground or substantially ground by pull down FETs 1310A, 1310B, 1320A and 1320B. Consequently, current flows through resistive element 1350 from output node O1 to output node O3. As a result, the voltage at output node O3 increases. Once the voltage at output node O3 exceeds the threshold voltage of pull up FET 1330, pull up FET 1330 turns on, and the voltage at output node O2 increases toward power voltage Vb. In some embodiments, power voltage Vb is equal or substantially equal to power voltage Va. The increase in the voltage at output node O2 is coupled by capacitor 1360 to output node O1 and from output node O1 to output node O3 through resistive element 1350. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

As understood by those of skill in the art, a three input NAND gate may be formed by adding:
- an additional pull down FET 1310C connected in series with pull down FETs 1310A and 1310B between output node O2 and ground, and connected to a third input INC;
- an additional pull down FET 1320C connected in series with pull down FETs 1320A and 1320B between gate of FET 1330 and ground, and connected to the third input INC; and
- an additional dmode pull up FET 1340C connected in series with dmode pull up FETs 1340A and 1340B between power voltage Va and output node O1.

As understood by those of skill in the art, NAND gates having more than three inputs may be formed by similarly increasing the number of pull down FETs and dmode pull up FETs.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of NAND gate 1300.

Figure 15:
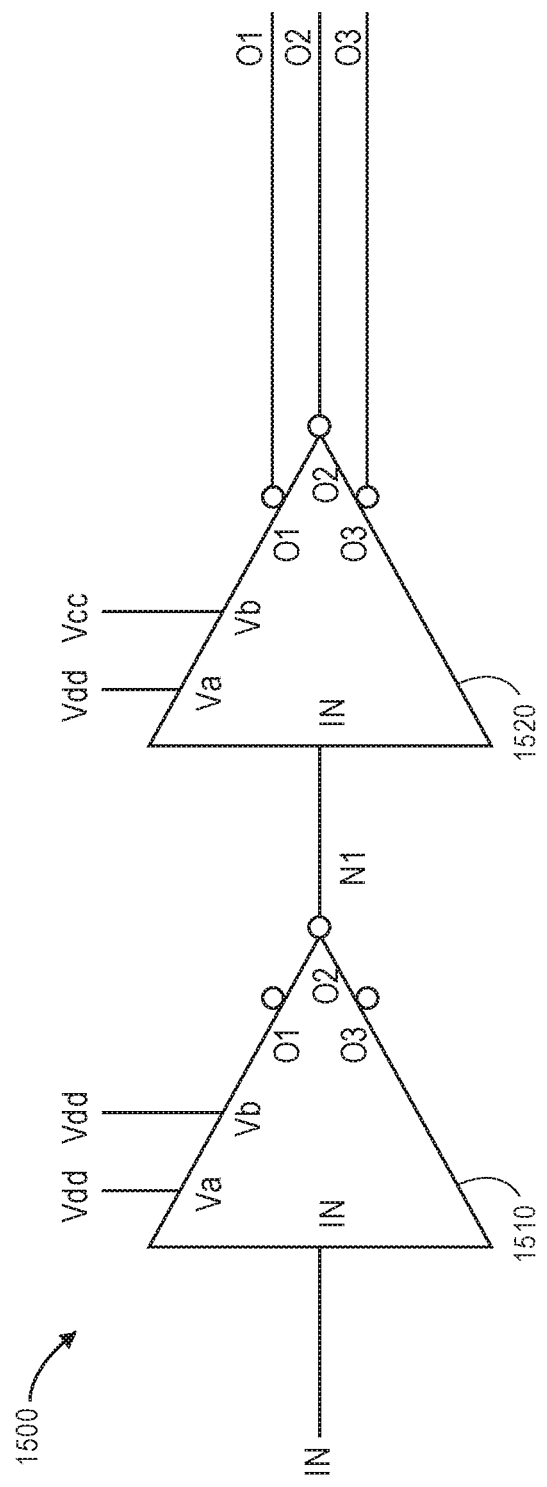
FIG. 15 is a simplified schematic of an embodiment of a GaN buffer.

FIG. 15 is a simplified schematic of an embodiment of a GaN buffer 1500. Buffer 1500 includes inverter 1510 and inverter 1520. Inverter 1510 may be similar or identical to any of inverters 100, 300, and 500 respectively illustrated in FIG. 1, FIG. 3, and FIG. 5. Other inverters may be used. Inverter 1520 may be similar or identical to any of inverters 300 and 500 respectively illustrated in FIG. 3 and FIG. 5. Other inverters may be used.

As illustrated in FIG. 15, the power supply connections Va and Vb of inverter 1510 are both connected to the power supply Vdd. Accordingly, as discussed in further detail below with reference to FIG. 16, the output of inverter 1510 changes between ground and Vdd. In addition, the power supply connections Va and Vb of inverter 1520 are respectively connected to Vdd and Vcc. Therefore, as discussed in further detail below with reference to FIG. 16, the outputs of inverter 1520 respectively change between Vdd+Vcc and Vdd, Vcc and ground, and Vdd+Vcc and ground.

Accordingly, a variety of level shifted signals are produced. In alternative embodiments, where no level shifting is required, the power supply connections Va and Vb of both inverters 1510 and 1520 may be connected to Vdd. In such embodiments, the outputs of inverter 1520 respectively change between 2×Vdd and Vdd, Vdd and ground, and 2×Vdd and ground.

Figure 16:
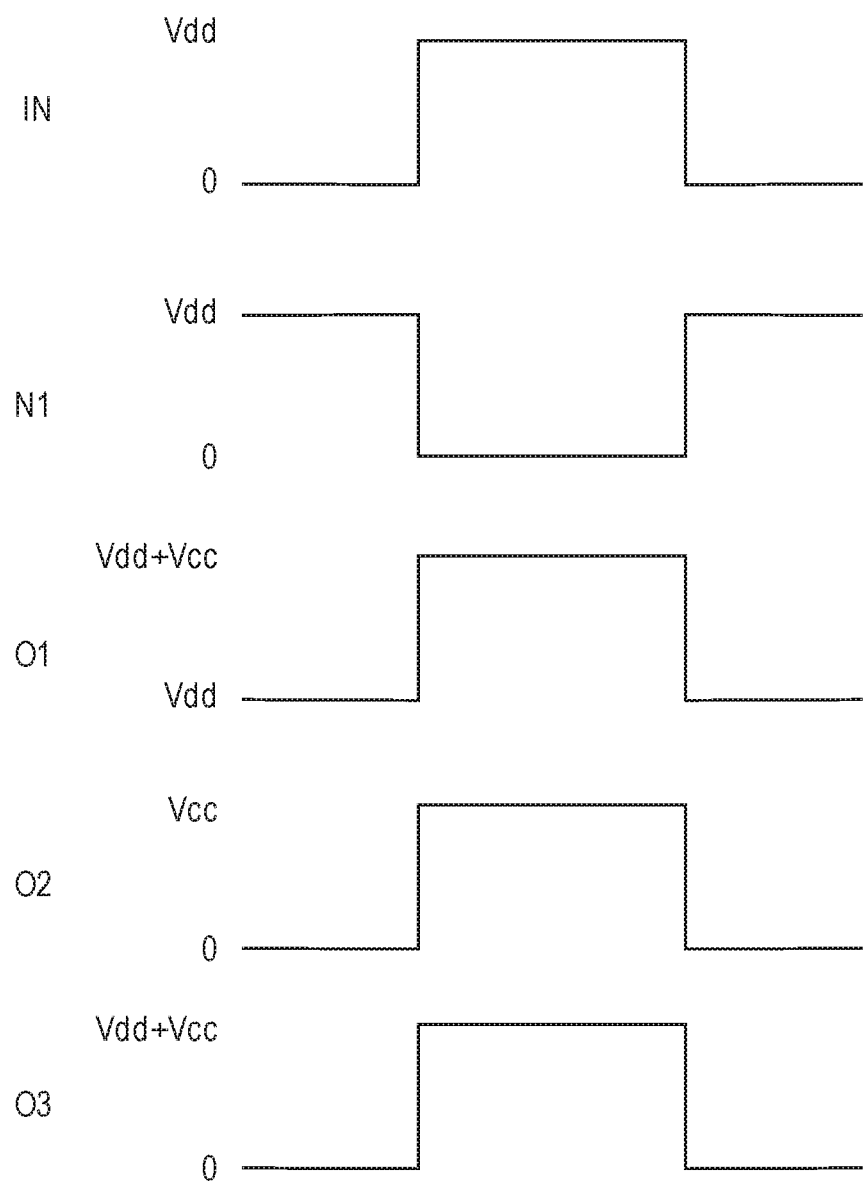
FIG. 16 is a waveform diagram illustrating the operation of the buffer of FIG. 15.

FIG. 16 is a waveform diagram illustrating the operation of the buffer of FIG. 15.

With reference to FIGS. 15 and 16, in operation, when the voltage at input IN is high (Vdd) the voltage at the output of inverter 1510 is low (0 or ground), according to the operation of inverter 1510, examples of which are described above with reference to inverters 100, 300, and 500, respectively illustrated in FIG. 1, FIG. 3, and FIG. 5. Furthermore, when the voltage at the output of inverter 1510 is low (0 or ground), the voltage at the output O1 of inverter 1520 is equal or substantially equal to Vdd+Vcc, the voltage at the output O2 of inverter 1520 is equal or substantially equal to Vdd, and the out voltage at the output O3 of inverter 1520 is equal or substantially equal to Vdd+Vcc, according to the operation of inverter 1520, examples of which are described above with reference to inverters 300 and 500, respectively illustrated in FIG. 3 and FIG. 5.

Figure 17:
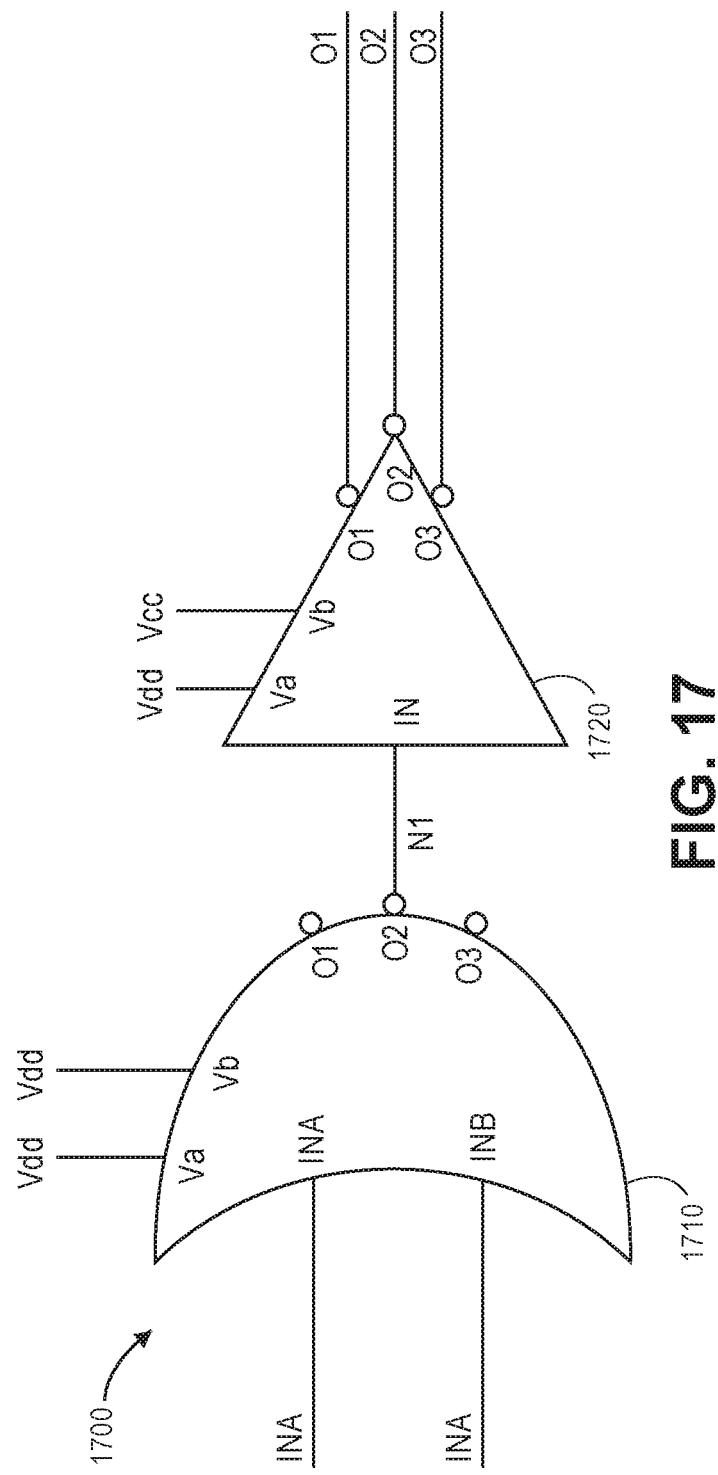
FIG. 17 is a simplified schematic of an embodiment of a GaN OR gate.

FIG. 17 is a simplified schematic of an embodiment of a GaN OR gate 1700. OR gate 1700 includes NOR gate 1710 and inverter 1720. NOR gate 1710 may be similar or identical to either of NOR gates 700 and 900, respectively illustrated in FIG. 7 and FIG. 9. Other NOR gates may be used. Inverter 1720 may be similar or identical to any of inverters 300 and 500, respectively illustrated in FIG. 3 and FIG. 5. Other inverters may be used.

As illustrated in FIG. 17, the power supply connections Va and Vb of NOR gate 1710 are both connected to the power supply Vdd. Accordingly, as discussed in further detail below with reference to FIG. 18, the output of NOR gate 1710 changes between ground and Vdd. In addition, the power supply connections Va and Vb of inverter 1720 are respectively connected to Vdd and Vcc. Therefore, as discussed in further detail below with reference to FIG. 18, the outputs of inverter 1720 respectively change between Vdd+Vcc and Vdd, Vcc and ground, and Vdd+Vcc and ground.

Accordingly, a variety of level shifted signals are produced. In alternative embodiments, where no level shifting is required, the power supply connections Va and Vb of both NOR gate 1710 and inverter 1720 may be connected to Vdd. In such embodiments, the outputs of inverter 1720 respectively change between 2×Vdd and Vdd, Vdd and ground, and 2×Vdd and ground.

Figure 18:
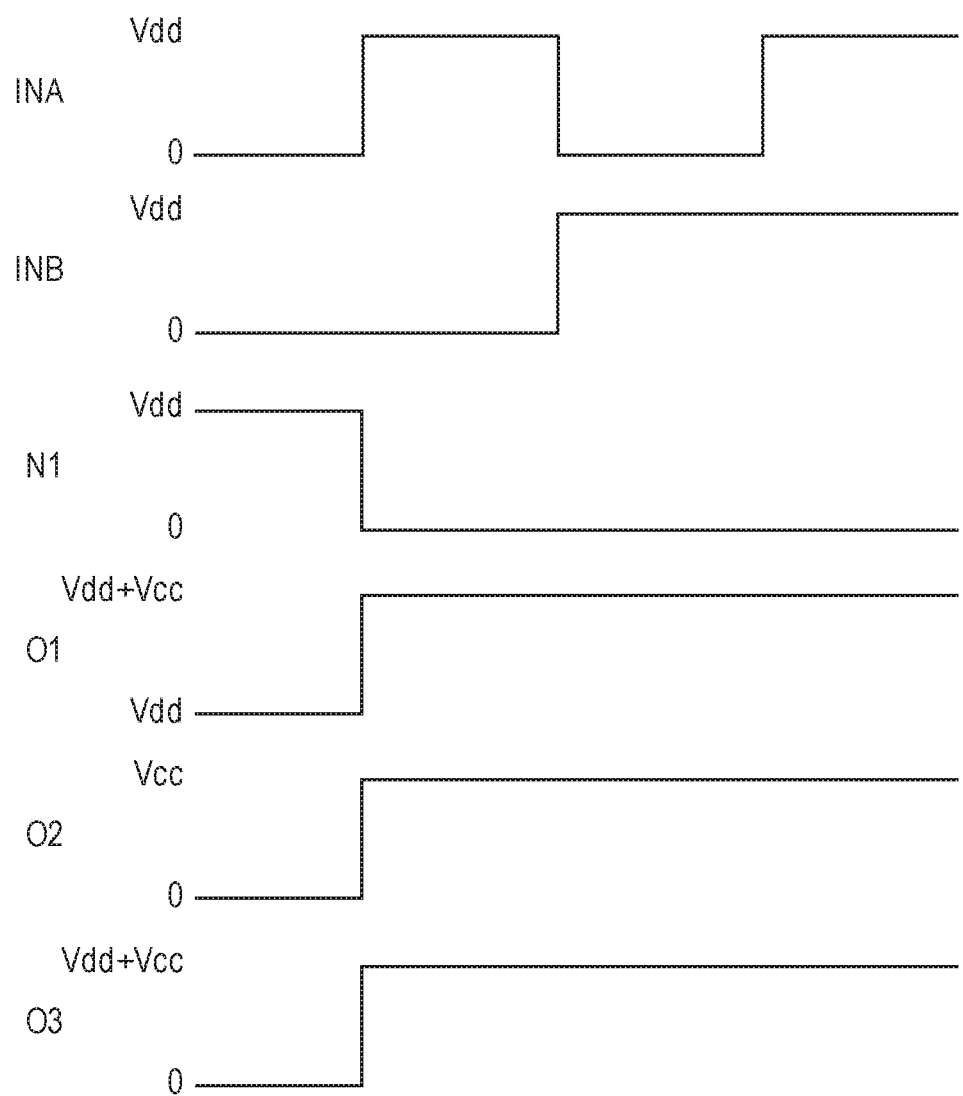
FIG. 18 is a waveform diagram illustrating the operation of the OR gate of FIG. 17.

FIG. 18 is a waveform diagram illustrating the operation of the OR gate of FIG. 17.

With reference to FIGS. 17 and 18, in operation, when the voltage at either input INA or INB is high (Vdd), the voltage at the output of NOR gate 1710 is low (0 or ground), according to the operation of NOR gate 1710, examples of which are described above with reference to NOR gates 700 and 900, respectively illustrated in FIG. 7 and FIG. 9. Furthermore, when the voltage at the output of NOR gate 1710 is low (0 or ground), the voltage at the output O1 of inverter 1720 is equal or substantially equal to Vdd+Vcc, the voltage at the output O2 of inverter 1720 is equal or substantially equal to Vdd, and the out voltage at the output O3 of inverter 1720 is equal or substantially equal to Vdd+Vcc, according to the operation of inverter 1720, examples of which are described above with reference to inverters 300 and 500, respectively illustrated in FIG. 3 and FIG. 5.

In addition, when the voltage at both inputs INA and INB are low (0 or ground), the voltage at the output of NOR gate 1710 is high (equal or substantially equal to Vdd), according to the operation of NOR gate 1710, examples of which are described above with reference to NOR gates 700 and 900, respectively illustrated in FIG. 7 and FIG. 9. Furthermore, when the voltage at the output of NOR gate 1710 is high, the voltage at the output O1 of inverter 1720 is equal or substantially equal to Vdd, the voltage at the output O2 of inverter 1720 is equal or substantially equal to ground, and the out voltage at the output O3 of inverter 1720 is equal or substantially equal to ground, according to the operation of inverter 1720, examples of which are described above with reference to inverters 300 and 500, respectively illustrated in FIG. 3 and FIG. 5.

Figure 19:
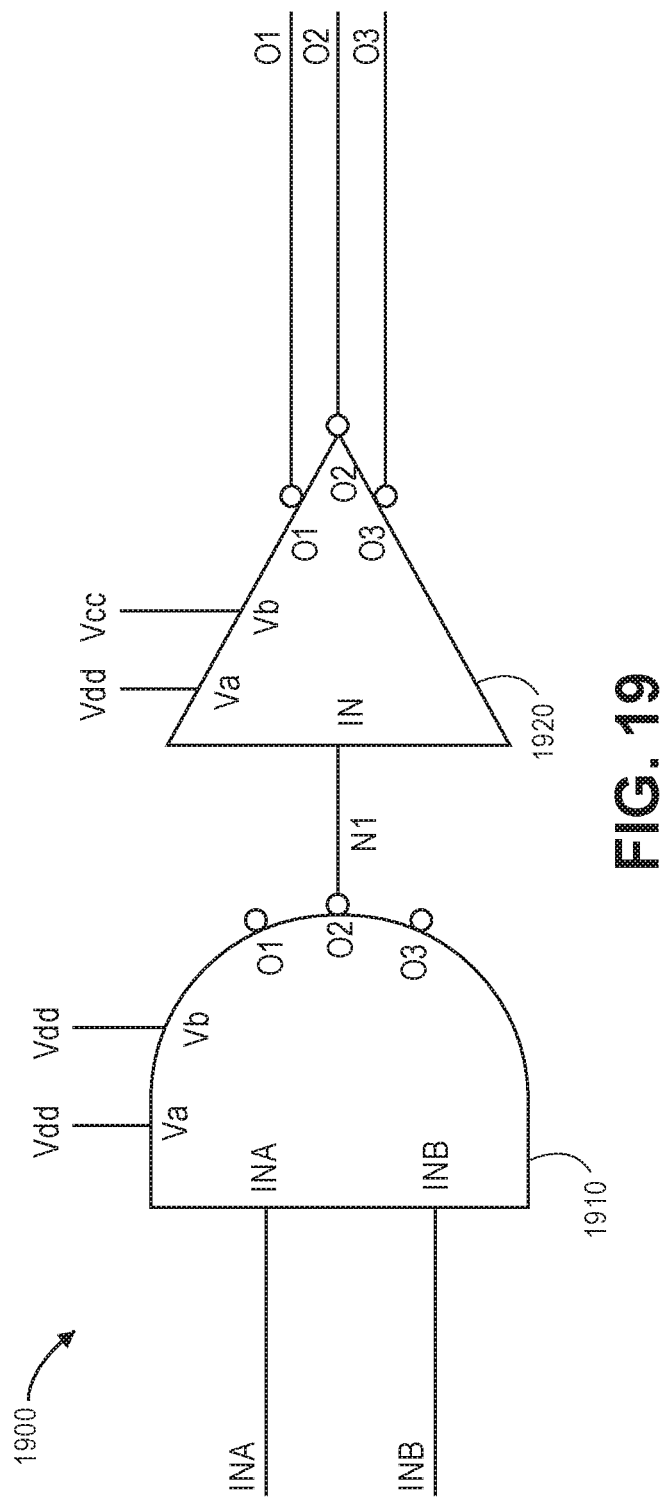
FIG. 19 is a simplified schematic of an embodiment of a GaN AND gate.

FIG. 19 is a simplified schematic of an embodiment of a GaN AND gate 1900. AND gate 1900 includes NAND gate 1910 and inverter 1920. NAND gate 1910 may be similar or identical to either of NAND gates 1100 and 1300, respectively illustrated in FIG. 11 and FIG. 13. Other NAND gates may be used. Inverter 1920 may be similar or identical to any of inverters 300 and 500, respectively illustrated in FIG. 3 and FIG. 5. Other inverters may be used.

As illustrated in FIG. 19, the power supply connections Va and Vb of NAND gate 1910 are both connected to the power supply Vdd. Accordingly, as discussed in further detail below with reference to FIG. 20, the output of NAND gate 1910 changes between ground and Vdd. In addition, the power supply connections Va and Vb of inverter 1920 are respectively connected to Vdd and Vcc. Therefore, as discussed in further detail below with reference to FIG. 20, the outputs of inverter 1920 respectively change between Vdd+Vcc and Vdd, Vcc and ground, and Vdd+Vcc and ground.

Accordingly, a variety of level shifted signals are produced. In alternative embodiments, where no level shifting is required, the power supply connections Va and Vb of both NAND gate 1910 and inverter 1920 may be connected to Vdd. In such embodiments, the outputs of inverter 1920 respectively change between 2×Vdd and Vdd, Vdd and ground, and 2×Vdd and ground.

Figure 20:
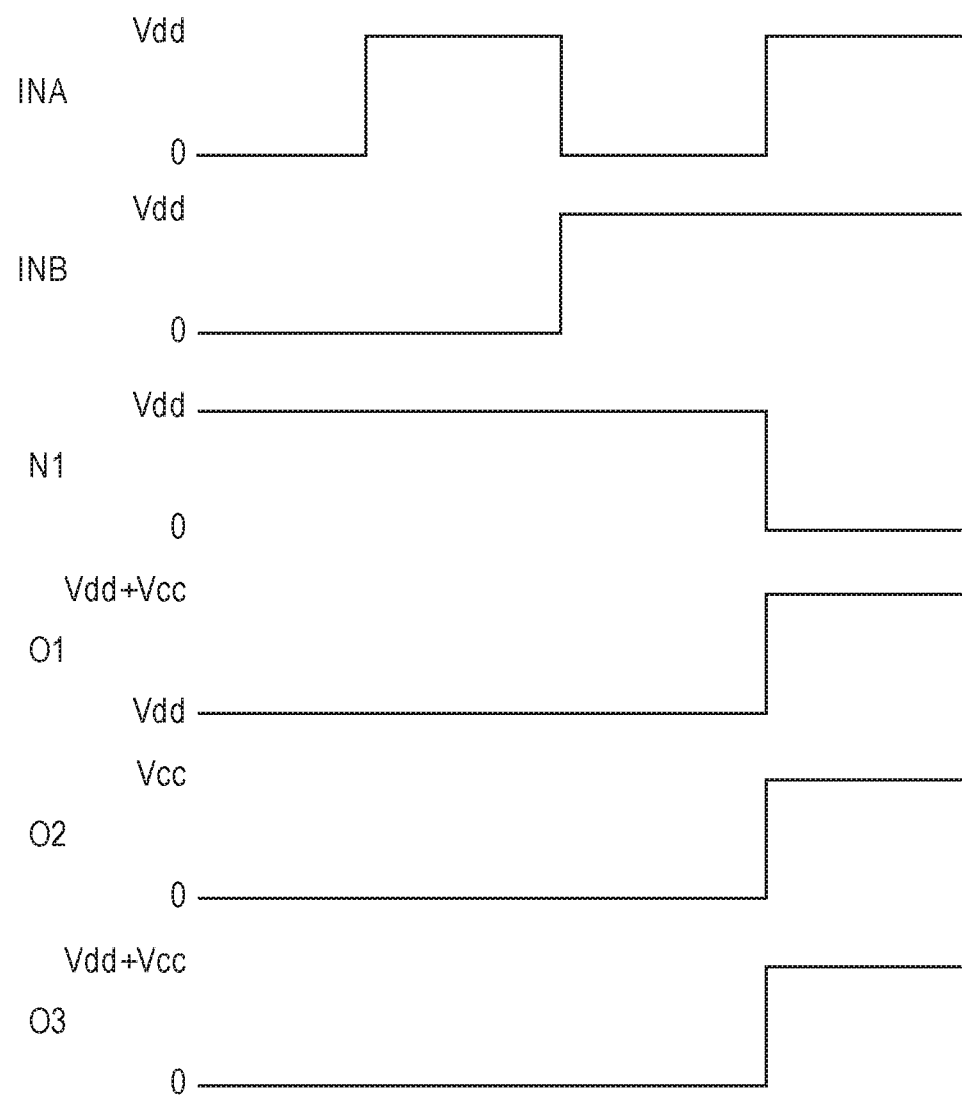
FIG. 20 is a waveform diagram illustrating the operation of the AND gate of FIG. 19.

FIG. 20 is a waveform diagram illustrating the operation of the AND gate of FIG. 19.

With reference to FIGS. 19 and 20, in operation, when the voltage at both inputs INA and INB are high (Vdd) the voltage at the output of NAND gate 1910 is low (0 or ground), according to the operation of NAND gate 1910, examples of which are described above with reference to NAND gates 1100 and 1300, respectively illustrated in FIG. 11 and FIG. 13. Furthermore, when the voltage at the output of NAND gate 1910 is low (0 or ground), the voltage at the output O1 of inverter 1920 is equal or substantially equal to Vdd+Vcc, the voltage at the output O2 of inverter 1920 is equal or substantially equal to Vdd, and the out voltage at the output O3 of inverter 1920 is equal or substantially equal to Vdd+Vcc, according to the operation of inverter 1920, examples of which are described above with reference to inverters 300 and 500, respectively illustrated in FIG. 3 and FIG. 5.

In addition, when the voltage at either of inputs INA and INB are low (0 or ground), the voltage at the output of NAND gate 1710 is high (equal or substantially equal to Vdd), according to the operation of NAND gate 1910, examples of which are described above with reference to NAND gates 1100 and 1300, respectively illustrated in FIG. 11 and FIG. 13. Furthermore, when the voltage at the output of NAND gate 1710 is high, the voltage at the output O1 of inverter 1720 is equal or substantially equal to Vdd, the voltage at the output O2 of inverter 1720 is equal or substantially equal to ground, and the out voltage at the output O3 of inverter 1720 is equal or substantially equal to ground, according to the operation of inverter 1720, examples of which are described above with reference to inverters 300 and 500, respectively illustrated in FIG. 3 and FIG. 5.

Figure 21:
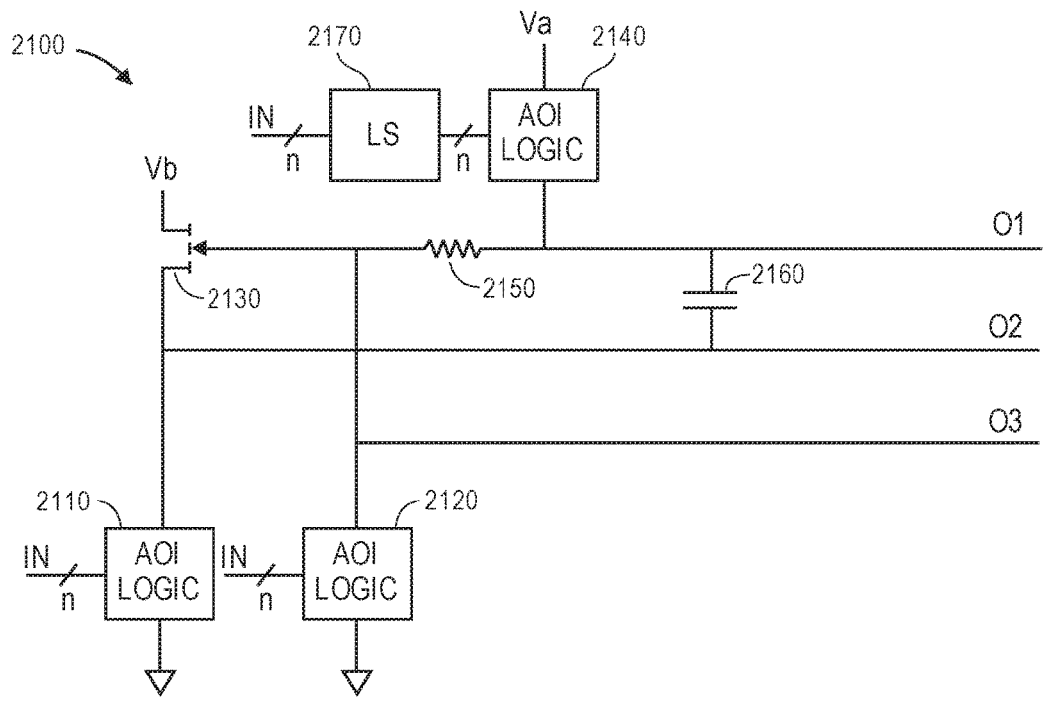
FIG. 21 is a simplified schematic of an embodiment of a GaN AOI gate.

FIG. 21 is a simplified schematic of an embodiment of a GaN And Or Invert (AOI) gate 2100. AOI gate 2100 includes pull down AOI logic 2110, pull down AOI logic 2120, pull up FET 2130, pull up AOI logic 2140, resistive element 2150, capacitor 2160, and level shift circuitry 2170. In some embodiments, resistive element 2150 comprises a passive resistor. In some embodiments, resistive element 2150 comprises a dmode FET having its gate electrode connected to either output node O1 or output node O3. In some embodiments, resistive element 2150 comprises both a passive resistor and a dmode FET having its gate electrode connected to either output node O1 or output node O3, where the drain and source terminals of the dmode FET are connected to opposite terminals of the passive resistor. In some embodiments, other level shift circuits are used instead of level shift FET 2170 and level shift capacitor 2180.

As illustrated in FIG. 21, AOI circuit 2100 receives a plurality of inputs at bus IN, and generates three outputs at nodes O1, O2, and O3, respectively. Any or all of the three outputs may be used as input signals to other circuitry. Which outputs are to be used is determined based on the functional needs of the other circuitry.

With reference to FIG. 21, in operation, as understood by those of skill in the art, pull down AOI logic 2110 selectively electrically connects output node O2 to ground based on the inputs at bus IN. Pull down AOI logic 2110 comprises an arrangement of FETs configured to electrically connect output node O2 to ground if a predetermined AND and OR logic condition of the inputs is met. Similarly, pull down AOI logic 2120 comprises an arrangement of FETs configured to electrically connect output node O3 to ground if the predetermined AND and OR logic condition of the inputs is met. Similarly, pull up AOI logic 2140 comprises an arrangement of FETs configured to electrically connect output node O1 to power voltage Va if the predetermined AND and OR logic condition of the inputs is met. A nonlimiting example of AOI logic is illustrated in FIG. 23.

Level shift circuit 2170 is configured to receive the inputs at bus IN and output level shifted versions of each of the inputs for pull up AOI logic 2140, which selectively electrically connects output node O1 to power voltage Va based on the level shifted versions of the inputs generated by level shift circuit 2170.

Figure 22:
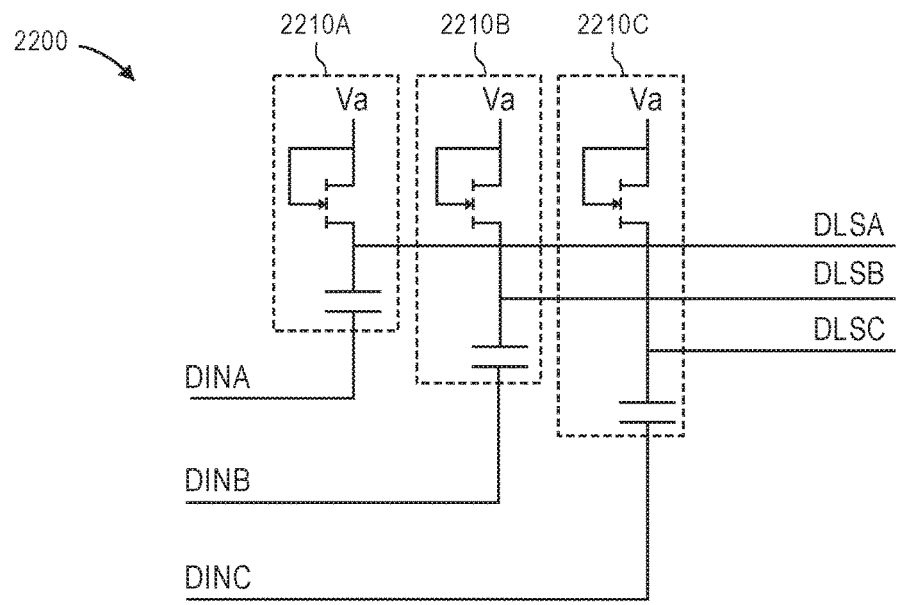
FIG. 22 is a simplified schematic of an embodiment of a level shift circuit, for example, for a GaN AOI gate.

FIG. 22 is a simplified schematic of an embodiment of a level shift circuit 2200, for example, for a GaN AOI gate, such as AOI gate 2100 of FIG. 21. In this embodiment the AOI gate has three inputs. Therefore, the level shift circuit 2200 has three level shifters 2210A, 2210B, and 2210C, which respectively receive three inputs DINA, DINB, and DINC, and respectively generate level shifted versions of the three inputs DINA, DINB, and DINC as output signals DLSA, DLSB, and DLSC, respectively. The operation of each of the level shifters 2210A, 2210B, and 2210C is similar or identical to that described above with reference to corresponding level shift structures each having a level shift capacitor and a level shift FET.

Figure 23:
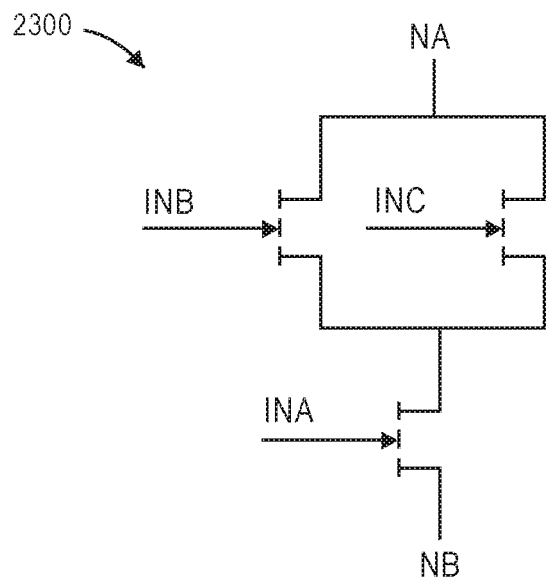
FIG. 23 is a simplified schematic of an embodiment of an AOI logic circuit for a GaN AOI gate.

FIG. 23 is a simplified schematic of an embodiment of an AOI logic circuit 2300 for a GaN AOI gate, such as AOI gate 2100 of FIG. 21. AOI logic circuit 2300 electrically connects nodes NA and NB in response to the inputs IINA, INB, and INC satisfying logic condition described by INA*(INB+INC). Accordingly, when used in AOI gate 2100, AOI gate 2100 has a logic functionality described by NOT(INA*(INB+INC)). AOI logic circuit 2300 is merely an example. Any number of other logic functions may be formed using other AOI logic circuits 2300, as understood by those of skill in the art.

In addition, while the input at node IN is low (0 or ground), the outputs at nodes O2 and O3 are not held to ground or substantially ground by pull down FETs 2110 and 2120. Consequently, current flows through resistive element 2150 from output node O1 to output node O3. As a result, the voltage at output node O3 increases. Once the voltage at output node O3 exceeds the threshold voltage of pull up FET 2130, pull up FET 2130 turns on, and the voltage at output node O2 increases toward power voltage Vb. The increase in the voltage at output node O2 is coupled by capacitor 2160 to output node O1 and from output node O1 to output node O3 through resistive element 2150. The voltages at output nodes O1, O2, and O3 continue to increase until the voltage at output node O2 becomes equal or substantially equal to the power voltage Vb, the voltage at output node O1 becomes equal or substantially equal to power voltage Va plus power voltage Vb, and the voltage at output node O3 becomes equal or substantially equal to power voltage Va plus power voltage Vb.

In some embodiments, power voltage Vb is equal or substantially equal to power voltage Va. Based on what voltages are supplied to the separate connections for power voltages Va and Vb, the voltage outputs are controllable. As understood by those of skill in the art, this allows for flexible design of the level shifting function of the inverter 2100.

Figure 24:
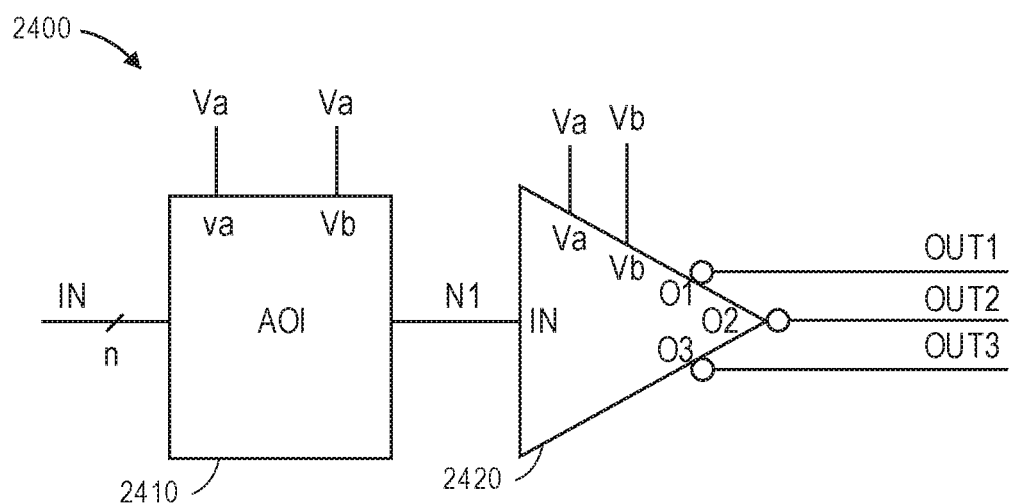
FIG. 24 is a simplified schematic of an embodiment of a GaN AO gate.

FIG. 24 is a simplified schematic of an embodiment of a GaN AO logic gate 2400. AO logic gate 2400 includes AOI gate 2410, which may be similar or identical to AOI gate 2100 discussed above. Other AOI gates may be used. In operation, AOI gate 2410 performs an AND OR INVERT operation on the inputs at bus IN to generate an output at node N1, as understood by those of skill in the art. AO logic gate 2400 also includes an inverter 2420. Inverter 2420 may be similar or identical to any of inverters 100, 200, and 300 discussed above. Other inverter circuits may be used. In operation, inverter 2420 generates outputs OUT1, OUT2, and OUT3based on signal at node N1, as understood by those of skill in the art.

As understood by those of skill in the art, the various circuits described herein may be combined to form more complex circuits. For example, using techniques known in the art, latches, flip-flops, XOR gates, and other circuits may be formed.

The FETs discussed herein are enhancement mode FETs unless they are designated otherwise as dmode (or depletion mode) FETs.

Each of the circuits discussed herein include one or more inventive features. The various features of the circuits may be applied to other embodiments of circuits in combinations of features which are contemplated, but not specifically discussed for the sake of brevity.

The various aspects of the devices discussed herein may be practiced in other semiconductor technologies. For example, the various aspects of the devices discussed herein may be practiced in Silicon, Germanium, Gallium Arsenide, Silicon Carbide, Organic, and other technologies.

While various embodiments of present invention have been described, it will be apparent to those of skill in the art that many more embodiments and implementations are possible that are within the scope of this invention. Accordingly, the present invention is not to be restricted except in light of the attached claims and their equivalents.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A GaN digital circuit, comprising:
a substrate comprising GaN;
a first output node on the substrate, wherein a voltage at the first output node is configured to switch between first and second voltages, wherein the first voltage is less than the second voltage;
a pull up switch on the substrate, the pull up switch comprising:
a gate,
a source connected to the first output node, and
a drain connected to a power supply node having a voltage equal to or substantially equal to the second voltage, wherein the pull up switch is configured to cause a voltage at the first output node to be equal to the second voltage in response to a voltage at the gate;
a capacitor on the substrate, the capacitor having a first terminal configured to cause the voltage at the gate to increase to substantially the sum of the second voltage and a third voltage in response to the voltage at the first output node increasing to the second voltage; and
a first depletion mode charging switch on the substrate, wherein the first depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage.

2. The GaN digital circuit of claim 1, wherein the first depletion mode charging switch comprises a gate, wherein the first depletion mode charging switch is configured to cause the voltage at the first terminal of the capacitor to become substantially equal to the second voltage in response to a voltage at the gate of the first depletion mode charging switch being substantially equal to the second voltage.

3. The GaN digital circuit of claim 1, wherein the second and third voltages are equal.

4. The GaN digital circuit of claim 3, wherein the voltage of the second output node is configured to switch between the third voltage and the sum of the second and third voltages.

5. The GaN digital circuit of claim 3, further comprising a third output node, wherein the third output node is connected to the gate of the pull up switch.

6. The GaN digital circuit of claim 5, further comprising a first pull down switch configured to cause a voltage at the first output node to be substantially equal to a ground voltage in response to a first input signal, wherein the first depletion mode charging switch is configured to cause the voltage at the first terminal of the capacitor to become substantially equal to the second voltage in response to the first input signal.

7. The GaN digital circuit of claim 6, wherein the gate of the first depletion mode charging switch and a gate of the first pull down switch are each electrically connected to the input signal.

8. The GaN digital circuit of claim 6, further comprising a second pull down switch comprising a gate electrically connected to the input signal, wherein the second pull down switch is configured to cause the voltage at the gate of the pull up switch to be substantially equal to the ground voltage in response to the first input signal.

9. The GaN digital circuit of claim 8, wherein in response to a second input signal:
the pull up switch is configured to cause the voltage at the first output to become substantially equal to the second voltage; and
the capacitor is configured to cause the voltages ant the second and third outputs to become substantially equal to the sum of the second and third voltages.

10. The GaN digital circuit of claim 9, wherein the second and third voltages are equal.

11. The GaN digital circuit of claim 1, further comprising a second output node, wherein the second output node is connected to the first terminal of the capacitor.

12. The GaN digital circuit of claim 1, wherein the first terminal of the capacitor is connected to the gate of the pull up switch through a resistive element.

13. The GaN digital circuit of claim 12, wherein the resistive element comprises a passive resistor element.

14. The GaN digital circuit of claim 12, wherein the resistive element comprises a depletion mode switch.

15. The GaN digital circuit of claim 1, wherein the voltage at the first output node is configured to switch between the first and second voltages in response to a single input, and the digital circuit performs at least one of a logical inversion and a logical buffer function.

16. The GaN digital circuit of claim 1, further comprising a second depletion mode charging switch on the substrate, wherein the second depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage, wherein the voltage at the first output node is configured to switch between the first and second voltages in response to first and second inputs, and the digital circuit performs at least one of a logical NOR function and a logical NAND function.

17. A GaN digital circuit, comprising:
a substrate comprising GaN;
first and second GaN digital logic circuits on the substrate, wherein an output of the first GaN digital logic circuit is electrically connected with an input of the second GaN digital logic circuit, wherein each of the first and second GaN digital logic circuits comprises:
a first output node on the substrate, wherein a voltage at the first output node is configured to switch between first and second voltages, wherein the first voltage is less than the second voltage;
a pull up switch on the substrate, the pull up switch comprising:
a gate,
a source connected to the first output node, and
a drain connected to a power supply node having a voltage equal to or substantially equal to the second voltage, wherein the pull up switch is configured to cause a voltage at the first output node to be equal to the second voltage in response to a voltage at the gate;
a capacitor on the substrate, the capacitor having a first terminal connected to the gate of the pull up switch, wherein the capacitor is configured to cause the voltage at the gate to increase to substantially the sum of the second voltage and a third voltage in response to the voltage at the first output node increasing to the second voltage; and
a first depletion mode charging switch on the substrate, wherein the first depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage.

18. The GaN digital circuit of claim 17, wherein the first GaN digital logic circuit further comprises a second depletion mode charging switch on the substrate, wherein the second depletion mode charging switch is configured to cause a voltage at the first terminal of the capacitor to become substantially equal to the third voltage while the voltage at the first output node is equal to or substantially equal to the first voltage and is configured to be substantially nonconductive while the voltage at the first output node is equal to or substantially equal to the second voltage, wherein the voltage at the first output node is configured to switch between the first and second voltages in response to first and second inputs, wherein the first GaN digital logic circuit performs one of a logical NOR function and a logical NAND function, and wherein the second GaN digital logic circuit performs a logic inversion function.

19. The GaN digital circuit of claim 17, wherein the first and second voltages of the first GaN digital logic circuit are equal.

20. The GaN digital circuit of claim 19, wherein the first and second voltages of the second GaN digital logic circuit are not equal.

* * * * *